(12) United States Patent
Azumada et al.

(10) Patent No.: US 7,547,918 B2
(45) Date of Patent: Jun. 16, 2009

(54) ACTIVE MATRIX SUBSTRATE AND ELECTRONIC DEVICE

(75) Inventors: Kyoko Azumada, Tenri (JP); Kenji Nakamura, Chiryu (JP); Atsushi Ban, Nara (JP); Tatsuya Fujita, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 136 days.

(21) Appl. No.: 11/158,041

(22) Filed: Jun. 22, 2005

(65) Prior Publication Data

US 2005/0285987 A1 Dec. 29, 2005

(30) Foreign Application Priority Data

| Jun. 23, 2004 | (JP) | ............................. 2004-185191 |
| Apr. 21, 2005 | (JP) | ............................. 2005-124254 |

(51) Int. Cl.
*H01L 29/04* (2006.01)
*H01L 29/15* (2006.01)

(52) U.S. Cl. .......................................... 257/72; 257/59
(58) Field of Classification Search .................. 257/59, 257/72; 349/43
See application file for complete search history.

(56) References Cited

U.S. PATENT DOCUMENTS

| 4,804,953 | A | * | 2/1989 | Castleberry | .................. 345/93 |
| 5,703,382 | A | * | 12/1997 | Hack et al. | ..................... 257/72 |
| 5,846,854 | A | | 12/1998 | Giraud et al. | |
| 6,147,408 | A | | 11/2000 | Ogure | |
| 6,413,845 | B1 | | 7/2002 | Izumi et al. | |
| 6,972,434 | B2 | * | 12/2005 | Misaki et al. | .................. 257/72 |
| 2003/0112382 | A1 | | 6/2003 | Takahashi et al. | |
| 2004/0183075 | A1 | * | 9/2004 | Koyama et al. | ............... 257/72 |
| 2006/0097262 | A1 | * | 5/2006 | Kim et al. | ..................... 257/72 |

FOREIGN PATENT DOCUMENTS

| JP | 64-029819 A | 1/1989 |
| JP | 9-120085 A | 5/1997 |
| JP | 9-504652 | 5/1997 |
| JP | 9-152623 A | 6/1997 |
| JP | 11-097441 A | 4/1999 |
| JP | 11-125831 | 5/1999 |
| JP | 11-142875 A | 5/1999 |
| JP | 2000-105548 A | 4/2000 |
| JP | 2000-305484 A | 11/2000 |
| JP | 2001-215526 A | 8/2001 |
| JP | 2001-242476 A | 9/2001 |
| JP | 2002-090776 A | 3/2002 |
| JP | 2002-222954 A | 8/2002 |
| JP | 2002-229061 A | 8/2002 |
| JP | 2002-250936 A | 9/2002 |

(Continued)

*Primary Examiner*—Kenneth A. Parker
*Assistant Examiner*—Joseph Nguyen
(74) *Attorney, Agent, or Firm*—Birch, Stewart, Kolasch & Birch, LLP

(57) ABSTRACT

An auxiliary line including a guide layer and an auxiliary metallic member is formed with respect to a signal transmitting line or a main auxiliary capacitance line formed on a glass substrate. The guide layer is formed in the same layer where pixel electrodes are formed. The auxiliary metallic member is formed by using a method such as an inkjet method, in which fine particles of metal is ejected or dropped.

38 Claims, 14 Drawing Sheets

FOREIGN PATENT DOCUMENTS

| | | |
|---|---|---|
| JP | 2003-100209 A | 4/2003 |
| JP | 2003-255383 A | 9/2003 |
| JP | 2003-309265 A | 10/2003 |
| JP | 2003-323131 A | 11/2003 |
| KR | 10-0222896 B1 | 7/1999 |
| KR | 10-2003-0084608 A | 11/2003 |

* cited by examiner

A—A

C—C

C-C

G-G

GENERAL DRIVING METHOD

PARTED DRIVING METHOD

ACTIVE MATRIX SUBSTRATE AND ELECTRONIC DEVICE

This Nonprovisional application claims priority under 35 U.S.C. § 119(a) on Patent Applications No. 2004/185191 filed in Japan on Jun. 23, 2004, and No. 2005/124254 filed in Japan on Apr. 21, 2005, the entire contents of which are hereby incorporated by reference.

FIELD OF THE INVENTION

The present invention relates to an active matrix substrate which has been widely used in a liquid crystal display, an organic electro luminescent display, or the like.

BACKGROUND OF THE INVENTION

An active matrix substrate has been used in, for example, a liquid crystal display and an organic EL (electro luminescent) display. This active matrix substrate conventionally includes metal wiring, such as signal lines and scanning lines, and pixel electrodes. The metal wiring and the pixel electrodes are generally formed as follows. Namely, a metal thin film is formed by carrying out a spattering method using a metal target, or an evaporation method. On this metal thin film, a mask is formed by carrying out a photolithography. Then, a desirable pattern of the metal wiring and the pixel electrodes are formed by carrying out a dry etching or a wet etching with respect to the mask.

A film thickness of the metal thin film, from which the metal wiring or the pixel electrode is formed, is found based on (i) a pattern which is specified by a width of the wiring or the like to be formed and (ii) a required resistance value. An entire thickness of the entire metal thin film is determined in accordance with a region which requires the most thickness.

Now it is possible to form, on the periphery of the active matrix substrate, driver elements or elements each having a part of function of the driver element so that the active matrix substrate and the elements are integral with each other. This is attributed to recent improvements in a technology for switching element, such as a poly silicon TFT or the like. In this case, a resistance value required in the metal wiring for supplying power and a signal or the like to these elements is lower than that required in a conventional signal line and scanning line.

Further, in an active matrix substrate, adopting an external driving method, such as TAB (Tape Automated Bonding) and COG (Chip On Glass), the active matrix substrate is provided with wiring for use in transmitting signals between TAB chips, or COG chips. This simplifies an external circuit board. Due to an increase in a size of a display in recent years, it is necessary, in many cases, that this wiring also have a lower resistance value than that required in the conventional signal line and scanning line.

In order to reduce the resistance of wiring and a terminal which require a low resistance as mentioned above, each of the wiring and the terminal may be provided thereon or thereunder with an auxiliary metallic member. The following describes examples of a method for using a metal material entirely or partially in the wiring or the terminal.

Firstly, there is a method in which an Ni film or the like is provided. This Ni film or the like will serve as (i) metal for facilitating growth of a plated film to become foundation wiring for plated wiring, or (ii) metal for improving adhesiveness with respect to deposited metal. Further, there is a method in which Ti or the like is provided to serve as metal for improving (i) an electric contact with a semiconductor and/or heterogeneous metal, and/or (ii) adhesiveness needed in a formation of a metallic film on a substrate. Further, there is a method in which an Au thin film or a solder plating material is arranged on a top surface of a terminal, in order to improve an electric contact between the terminal and wiring. There is also a method in which Ti or Pd is provided on a top surface of wiring, for preventing damages from plasma used in a semiconductor process.

Japanese Unexamined Patent Publication No. 152623/1997 (Tokukaihei 9-152623; published on Jun. 10, 1997) discloses a method for lowering a resistance of a leader terminal formed in a terminal section by forming a metallic light shielding film on a glass substrate. In the method, a metallic film for an auxiliary electrode is formed in advance so as to have substantially a same pattern as a pattern of the leader terminal. Then, the leader terminal is formed on the metallic film for the auxiliary electrode. Thus, it is possible to realize the lowering of the resistance of the leader terminal.

Further, Japanese Unexamined Patent Publication No. 2001-215526 (Tokukai 2001-215526; published on Aug. 10, 2001) discloses a method for forming a metallic film having a low resistance on an electrode terminal. The metallic film is made of noble metal. In the method, the metallic film is formed by depositing and aggregating the noble metal from a colloid solution containing the noble metal.

Further, Japanese Unexamined Patent Publication No. 120085/1997 (Tokukaihei 9-120085; published on May 6, 1997) discloses a method in which low resistance wiring (e.g. W) on a glass substrate is formed at the bottom of Ta wiring by carrying out a spattering method.

Further, Japanese Unexamined Patent Publication No. 97441/1999 (Tokukaihei 11-97441; published on Apr. 9, 1999) discloses a method in which (i) Cu wiring is formed in a groove on a silicon substrate, and (ii) a surface of the Cu wiring is polished and leveled.

In realization of peripheral wiring necessitating low resistance, when increasing a thickness of a metallic layer by using the foregoing conventional method such as the spattering method or the evaporation method, an entire thickness of matrix wiring increases, as described above. This is because the metallic layer is used as all the metallic layers for forming the matrix wiring such as signal lines and scanning lines.

The lowering of the resistance in the foregoing active matrix substrate does not necessarily have to be carried out with respect to the entire wiring on the active matrix substrate. In many cases, it is necessary for the lowering of resistance to be carried out only with respect to some wiring necessitating the low resistance. For example, in the foregoing example, it is necessary to lower the resistance of only a power supplying line for the driver element on the periphery of the active matrix substrate, and a grounding line.

Meanwhile, the wire may be damaged when the wire is in an environment during a step, i.e., in an environment that causes the wire to have an etching solution, an etching plasma atmosphere, a resist solution, a peeling solution, and the like. In view of the circumstances, the wiring is coated with a material having a resistance against such an environment. Note that this may not always be the case, i.e., not the entire wire is always damaged. In such a case, a partial coating may be enough.

However, a film formation, which is carried out by using a conventional spattering method or evaporation method, causes the metallic film for the wiring to be formed on the entire surface of the substrate. This results in an increase in the thicknesses of the signal lines and the scanning lines which do not necessitate low resistances. This further causes an interlayer insulation layer to have a poor coverage characteristic, so as not to uniformly cover the signal and scanning lines. Note that the interlayer insulation layer is an interlayer insulation layer in an overlap portion of the wiring lines, for example an interlayer insulation layer in a portion where a signal line and a scanning line intersect with each other. This may increase a possibility of defects such as short-circuiting of a wiring line and its upper layer. If nothing is done to the thickness of the upper layer, the upper layer may have a disconnection at its step portion. In order to avoid this problem, it becomes inevitably necessary to further increase the film thickness.

Further, a use of the spattering method or the evaporation method for increasing the thickness of the metallic film causes the metallic film to be easily peeled off when a stress is applied to the film. Moreover, the use of the spattering method or the evaporation method for increasing the thickness of the metallic film is disadvantageous in terms of cost. This is because, the same process has to be repeated, and a large amount of material cost is needed.

Further, in a case where a dry etching is carried out for patterning a thicken metallic film, it is necessary that resist remain longer than the time taken for the etching. This requires that the resist with sufficient thickness be formed. Alternatively, in a case of carrying out a wet etching, an increase in the thickness of the resist causes a poor circulation of etching liquid. This may cause a poor etching accuracy. Thus, patterning of the metallic film becomes difficult.

As described, in order to partially lower the resistance of the wiring, the metallic layer formed by the spattering method or evaporation method is used for increasing the film thickness. This method however influences a process time taken for process such as a film forming process, an etching process, or the like which is carried out with respect to the entire portion of the wiring. This causes deterioration in the productivity of a production line.

On the other hand, according to the foregoing Tokukaihei 9-152623 and Tokukai 2001-215526, the metallic film for the auxiliary electrode is formed at least a portion of the wiring, so that the resistance of the electrode terminal is lowered. However, the foregoing Tokukaihei 9-152623 and Tokukai 2001-215526 causes the following problems.

Firstly, in Tokukaihei 9-152623, the pattern of the metallic film for the auxiliary electrode is formed at the same time the metallic light shielding film is formed. This allows only a limited portion of the wiring (i.e., not the entire wiring) to have the low resistance by using the metallic film for the auxiliary electrode. Further, if the metallic film for the auxiliary electrode is formed by a spattering method or the like, the metallic film is formed in a wide range. Further, the number of photolithography process for patterning also increases. As described, it is extremely disadvantageous, in terms of cost, to carry out the photolithography process twice during a process of forming a single layer of wiring.

In Tokukai 2001-215526, an auxiliary metallic film is aggregated and deposited from the colloid solution of the noble metal by using Joule heat generated by passing an electric current. It is however presumed that the aggregation and deposition of the noble metal by using Joule heat is unfeasible. That is, an extremely large current is needed in order to generate such a Joule heat that is sufficiently high for causing deposition and aggregation of the noble metal. This extremely large current, if supplied to the wiring, may cause burning out of the wiring or other problems. Further, even if the method of Tokukai 2001-215526 allows a formation of the auxiliary metallic film with a small area like a terminal, the method is not suitable for forming the auxiliary metallic film having a large area like wiring or a pixel electrode.

Further, the method of Tokukai 2001-215526 has the following problems. Namely, with the method, the auxiliary metallic film can be formed only on a transparent conductive film. Further, since the colloid solution of the noble metal is applied on a substrate by using a spin coating method, the auxiliary metallic film is formed on the entire surface of the substrate. This causes an increase in the material cost for the noble metal colloid.

The above mentioned problems are true not only in terms of lowering the resistance, but also in terms of realizing the resistance against the process environment.

SUMMARY OF THE INVENTION

An object of the present invention is to provide an active matrix substrate which (i) lowers a resistance of a specific portion of wiring, and (ii) improves a resistance against a process environment or the like.

In order to achieve the foregoing object, an active matrix substrate of the present invention includes: a substrate; a plurality of signal lines; a plurality of scanning lines intersecting with the signal lines; switching elements, each being arranged nearby a portion where one of the signal lines intersects with one of the scanning lines; a peripheral line having at least a part of function of supplying signals to the signal lines and the scanning lines, the signal lines, the scanning lines, the switching elements, and the peripheral line being provided on the substrate, the active matrix substrate including a conductive auxiliary member, which is formed at least in a portion of wiring constituting the active matrix substrate.

Further, in order to achieve the foregoing object, another active matrix substrate of the present invention includes: a substrate; a plurality of signal lines; a plurality of scanning lines intersecting with the signal lines; switching elements, each being arranged nearby a portion where one of the signal lines intersects with one of the scanning lines; pixel electrodes respectively connected with the switching elements; a peripheral line having at least a part of function of supplying signals to the signal lines and the scanning lines, the signal lines, the scanning lines, the switching elements, and the peripheral line being provided on the substrate, the active matrix substrate including a conductive auxiliary member, which is formed at least in a portion of wiring constituting the active matrix substrate or in a portion of a pixel electrode.

In the foregoing configuration, the conductive auxiliary material is used for increasing the thickness of a specific portion of the wiring, while keeping the same thickness in the rest of the wiring. Thus, it is possible to lower the resistance of only a portion of the wiring.

Additional objects, features, and strengths of the present invention will be made clear by the description below. Further, the advantages of the present invention will be evident from the following explanation in reference to the drawings.

DESCRIPTION OF THE EMBODIMENTS

An embodiment of the present invention is described below, with reference to the Figures. The following deals with a case where the present invention is applied to manufacturing of an active matrix substrate. First described is a configuration of the active matrix substrate.

Figure 2:
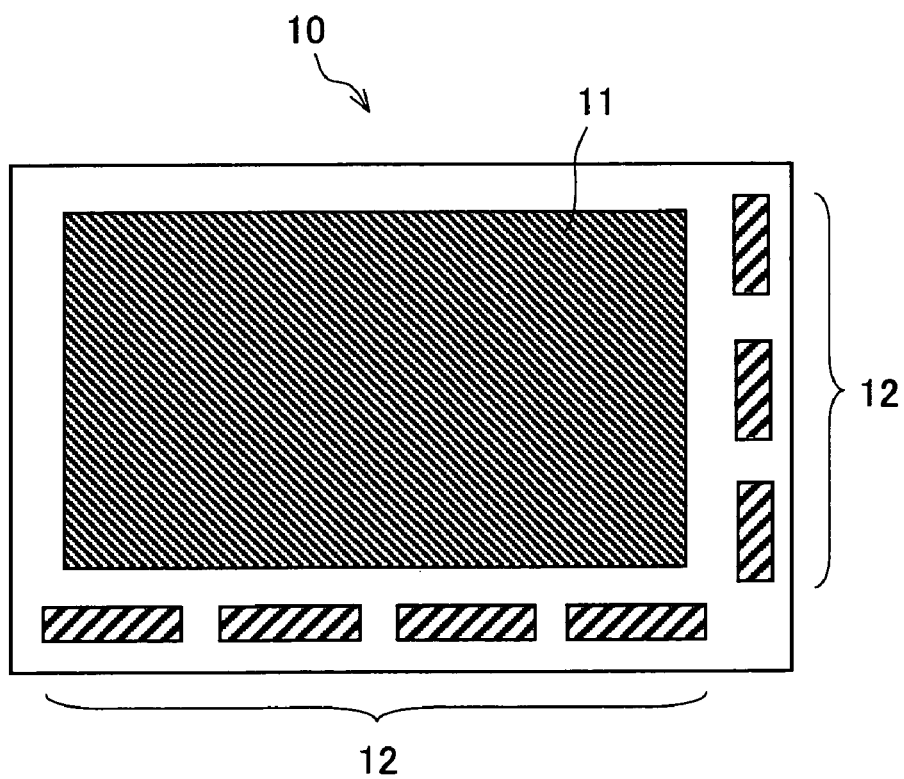
FIG. 2 is a plane view illustrating a schematic configuration of the active matrix substrate.

FIG. 2 is a plane view illustrating a schematic configuration of an active matrix substrate 10. As shown in FIG. 2, the active matrix substrate 10 includes an image forming region 11 and a panel-peripheral region 12. A plurality of gate lines and a plurality of source lines are arranged in the image forming region 11 so as to be orthogonal to each other. A pixel is provided in each region compartmentalized by a gate line and a source line, thereby allowing a plurality of pixels to be provided in a matrix-manner. The respective pixels provided in a matrix manner operate in the image forming region 11, thereby allowing the image forming region 11, in its entirety, to display images, FIGS. 3(a) and 3(b) illustrate a schematic configuration of a pixel 20 in the image forming region 11. As shown in FIG. 3(a), a pixel 20 includes a TFT (Thin Film Transistor) 21 nearby a portion where a gate line 31 and a source line 32 intersect with each other. This TFT 21 serves as a switching element. Further, an auxiliary capacitance line 33 is provided between the adjacent gate lines 31.

As shown in FIG. 3(b), in the active matrix substrate 10, the gate line 31 and the auxiliary capacitance line 33 are formed on a glass substrate 13, and a gate insulation layer 34 is provided on the gate line 31 and the auxiliary capacitance line 33. From the gate line 31, a gate electrode 22 is branched off. Formed above the gate electrode 22 are an amorphous silicon layer 23, an n+ type silicon layer 24, a source electrode 25, and a drain electrode line 26, which constitute the TFT 21. Here, the source electrode 25 is formed so as to be branched off from the source line 32.

Further, the drain electrode line 26 in the TFT 21 extends from the TFT 21 to a contact hole 35. This drain electrode line 26 serves as a drain electrode of the TFT 21, and electrically connects the TFT 21 with the pixel electrode 36. Further, the drain electrode line 26 causes an electric capacitance (auxiliary capacitance) to be formed between the drain electrode line 26 and the auxiliary capacitance line 33. Note that, formed on the pixel 20 are (i) a protection layer 37, (ii) a resin layer 38 for, for example, leveling the pixel 20, and (iii) a pixel electrode 36 via which a voltage is applied to a liquid crystal layer. Note further that the contact hole 35 is perforated through the protection layer 37 and the resin layer 38.

Figure 4:
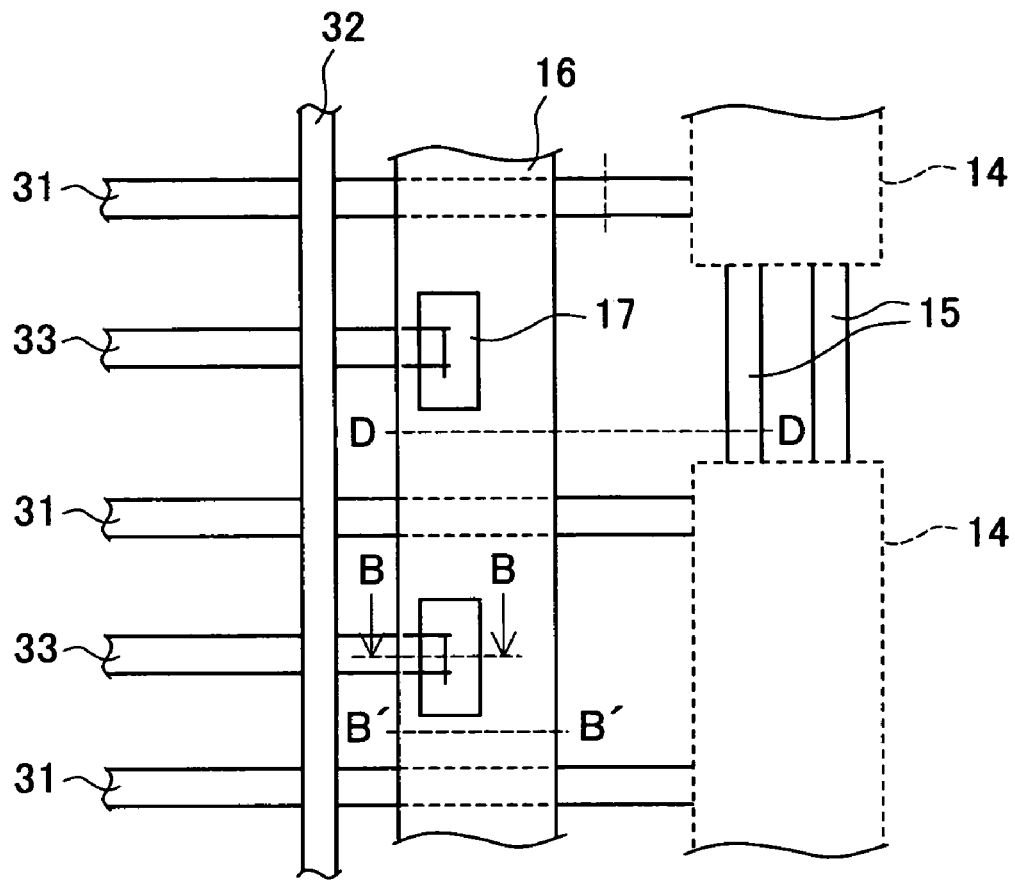
FIG. 4 is a plane view illustrating a configuration of a panel-peripheral region of the active matrix substrate.

On the other hand, as shown in FIG. 4, in the panel-peripheral region 12, the gate line 31 and the source line 32, each for driving the pixels 20, are put together. A plurality of gate lines 31 are connected to a driver element (a gate driver) 14 of a plurality of driver elements, and a plurality of source lines 32 are connected to a driver element (source driver) 14 of the driver elements. Each of the driver elements is for supplying a signal to the gate line 31 or the source line 32. Further, the panel-peripheral region 12 includes (i) signal transmitting lines 15 via which signals are transmitted between the driver elements 14, and (ii) a main auxiliary capacitance line 16 connected with the auxiliary capacitance line 33. Note that FIG. 4 is a plane view showing a part of the panel-peripheral region 12. In FIG. 4, the gate line 31 and the auxiliary capacitance line 33, each extending from the pixel region 21, are connected with the driver element (gate driver) 14 and the main auxiliary capacitance line 16.

The main auxiliary capacitance line 16 and the source line 32 are formed in a single layer. The gate line 31 and the auxiliary capacitance line 33 are formed via the gate insulation layer 34, in a lower layer under the source line 32. Thus, the gate line 31 extends, under the main auxiliary capacitance line 16, towards a connection terminal of the driver element 14. On the contrary, the auxiliary capacitance line 33 is connected with the main auxiliary capacitance line 16 which is above the line 33, via a through hole 17 formed in the gate insulation layer 34.

Further, the signal transmitting lines 15 are provided between the driver elements 14, so as to connect adjacent driver elements 14 via respective corresponding input terminals.

Figure 5:
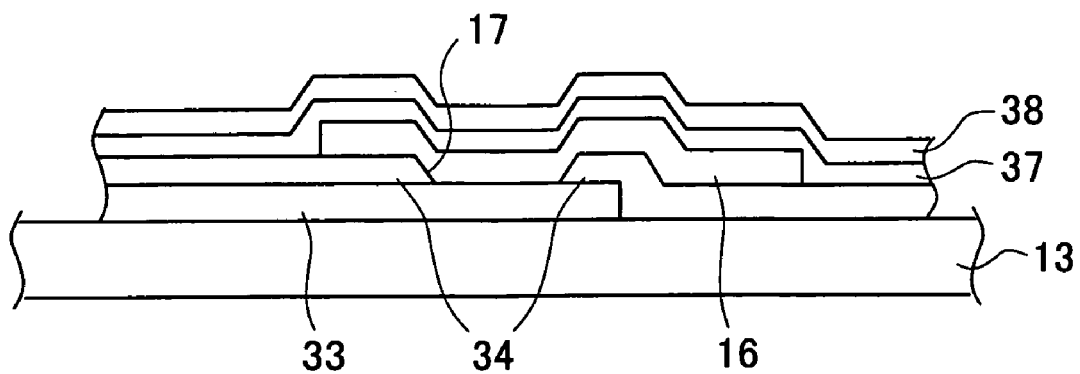
FIG. 5 is a cross sectional view of the panel-peripheral region of the active matrix substrate, and is illustrating a portion where a main auxiliary capacitance line and an auxiliary capacitance line are connected with each other.

FIG. 5 is a cross sectional view taken along the line B-B' in FIG. 4, and is illustrating a portion where the main auxiliary capacitance line 16 is connected with the auxiliary capacitance line 33. As shown in FIG. 5, the main auxiliary capacitance line 16 is provided on the gate insulation layer 34. The auxiliary capacitance line 33 is formed on the glass substrate 13. Between the main auxiliary capacitance line 16 and the auxiliary capacitance line 33, there is provided the gate insulation layer 34 serving as an interlayer insulation layer. The main auxiliary capacitance line 16 and the auxiliary capacitance line 33 are connected with each other via the through hole 17 formed in the gate insulation layer 34.

Figure 6:
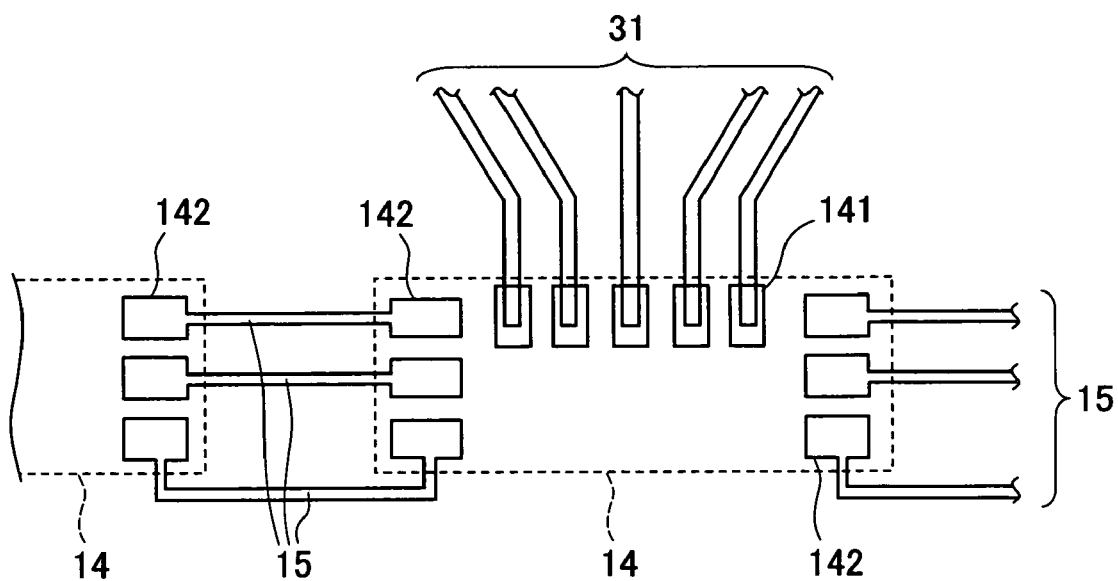
FIG. 6 is a plane view of the panel-peripheral region of the active matrix substrate, illustrating a configuration of a region where a driver element are provided.

FIG. 6 schematically illustrates the signal transmitting line 15 formed on the periphery of the driver elements 14, and output terminals 141 and input terminals 142 in the driver element 14.

In FIG. 6, a plurality of the gate lines 31 extending from the pixel formation region 21 are directed to respective corresponding output terminals 141. These gate lines 31 are connected with the driver element 14 via the respective corresponding output terminals 141. Further, the input terminal 142 is so formed as to sequentially transmit a signal via the driver element 14, and the adjacent driver elements 14 are connected with each other via the signal transmitting lines 15. Note that a signal passing through the output terminal 141 is identical with a signal passing through the input terminal 142 in the driver element 14. Namely, a single signal is sequentially transmitted and communicated between adjacent driver elements 14, via an input terminal 142 and an output terminal 141 which correspond to each other.

Figure 7:
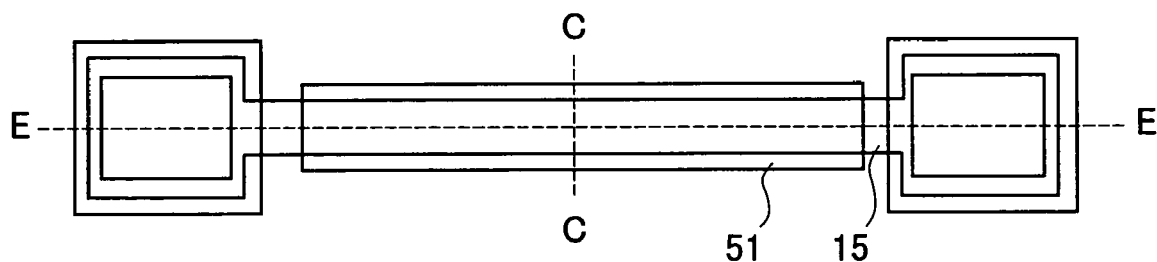
FIG. 7(a) is a plane view schematically illustrating a signal transmitting line for electrically connecting a plurality of the driver elements with each other.
FIG. 7(b) is a cross sectional view taken along the line C-C' in FIG. 7(a).
Figure 7:
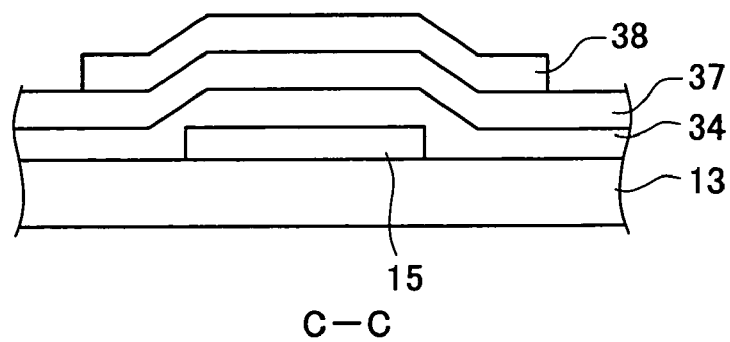

FIG. 7(a) is a plane view schematically illustrating the signal transmitting line 15 electrically connecting the driver elements 14 with each other, and FIG. 7(b) shows a cross sectional view taken along the line C-C' in FIG. 7(a). The signal transmitting line 15 is formed on the glass substrate 13, and is formed in the layer where the gate line 31 is formed. Thus, the signal transmitting line 15 is formed in the layer where the auxiliary capacitance line 33 is formed, but not in the layer where the main auxiliary capacitance line 16 is formed.

Figure 1:
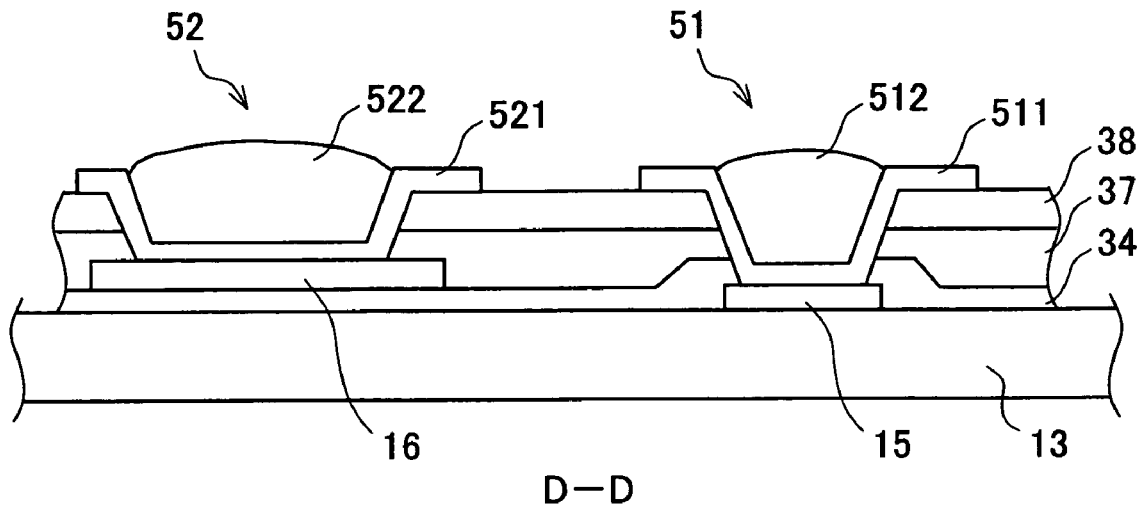
FIG. 1 is a cross sectional view according to an embodiment of the present invention, illustrating a configuration of an auxiliary metallic member formed on wiring of an active matrix substrate.

The following describes features of the present invention. The active matrix substrate 10 of the present embodiment partially has wiring configured as shown in FIG. 1. FIG. 1 is a cross sectional view taken along the line D-D' in FIG. 4, and illustrates a portion where the signal transmitting line 15 in association with the driver elements 14 and the main auxiliary capacitance line 16 in the panel-peripheral region 12.

In the configuration shown in FIG. 1, formed on/above the glass substrate 13 are the signal transmitting line 15, the gate insulation layer 34, and the main auxiliary capacitance line 16. Further, on the gate insulation layer 34 and the main auxiliary capacitance line 16, the protection layer 37 and the resin layer 38 are formed and laminated in this order. Further, auxiliary lines 51 and 52 are formed on the signal transmitting line 15 and the main auxiliary capacitance line 16, respectively. The auxiliary lines 51 and 52 respectively contact the signal transmitting line 15 and the main auxiliary capacitance line 16.

The auxiliary lines 51 and 52 have (i) guide layers 511 and 521, and (ii) auxiliary metallic members 512 and 522, respectively. The guide layers 511 and 521 are formed in the layer where the pixel electrode 36 is formed, by using an ITO (Indium Tin Oxide) film from which the pixel electrode 36 is formed. This ITO film is formed after the resin layer 38, the protection layer 37, and/or the gate insulation layer 34 are formed. In the protection layer 37, the resin layer 38, and the gate insulation layer 34, through holes are formed during the same process as that for the contact hole 35 for connecting the drain electrode with the pixel electrode 36 in the TFT 21. These through holes allow the guide layers 511 and 521 to connect with the signal transmitting line 15 and the main auxiliary capacitance line 16, respectively. Further, the auxiliary metallic members 512 and the 522 are so formed as to fill up internal space created by the guide layers 511 and 521, respectively.

As shown in FIG. 1, in the example of the present embodiment, the signal transmitting line 15 and the auxiliary lines 51 on the line 15 constitute a two-layer structure. Similarly, the main auxiliary capacitance line 16 and the auxiliary lines 52 on the line 16 constitute a two-layer structure. Since a new auxiliary line is thus provided on the conventionally-provided wiring, it is possible to reduce the total resistance of the wiring.

Particularly, in a large-size panel, the resistance of wiring inevitably increases because the wiring becomes long. This results in that the number of the wiring, to be connected with the driver element 14 on the periphery of the panel, becomes larger than that of the conventional panel. Accordingly, it is difficult to reduce a frame width of the panel. However, by reducing the resistance of the wiring, it is possible to reduce the number of the wiring to be connected to the driver element 14. This enables the reduction of the frame width of the panel. Further, in some cases, the signal transmitting line 15 is formed between the driver elements 14 on the substrate to simplify an external circuit board. In this case, it is necessary to form wiring having a narrow width in a narrow space. As such, it is necessary that the resistance of the wiring be lower than the conventional wiring, in order to prevent an increase in the resistance of the current wiring. In view of the requirement, the present invention is advantageous.

In a method of the present embodiment, for forming the wiring having the foregoing configuration, it is preferable that the auxiliary metallic members 512 and 522 be formed by using a pattern forming apparatus such as an inkjet apparatus that ejects or drops a material. With this method, it is possible to partially increase the thickness of the wiring, without an increase in the number of photolithography processes, and without an increase in the thickness of the entire wiring.

In the present embodiment, a material for the auxiliary metallic members 512 and 522 does not necessarily have the same metal material for the wiring provided thereunder; i.e., the main auxiliary capacitance line 16 and the signal transmitting line 15. Alternatively, it may be possible to use a material with a smaller surface resistance in order to reduce the resistance of the wiring. This material may be a material containing at least Ag, Au, Cu, or Al. Ag is used in this case.

The following description deals with an exemplary process of forming the foregoing auxiliary line, in the active matrix substrate 10 of the present embodiment.

First, a main auxiliary capacitance line 16 was formed in an appropriate portion where the line 16 will be formed, on the periphery of a liquid crystal display panel. TiN/Al/Ti is used as a material for the wiring is, and a spattering method is used for forming the wiring. A wiring-formation region in a 32 inch liquid crystal display panel was approximately 40 cm in length, and 800 μm in width. By carrying out the spattering method, wiring of approximately 4000 Å in film thickness was formed. The specific resistance of the entire TiN/Al/Ti used for forming the wiring was 4 μΩ·cm.

Thus, in the 32 inch-liquid crystal display panel, the resistance value of the wiring formed by using the spattered film of TiN/Al/Ti was approximately 50 Ω.

Further, the formation of the wiring was carried out in the same manner with respect to a portion of the main auxiliary capacitance line 16 nearby a 45 inch liquid crystal display panel. A wiring-formation region in this case was 56 cm in length, and 1700 μm in width (more than twice the width of the 32 inch liquid crystal display panel). The resistance value in this case was approximately 33 Ω. As described, the 45 inch liquid crystal display panel requires much wider wiring, whose width is more than twice the width of the wiring in the 32 inch liquid crystal display panel. Further, in order to form wiring of 800 μm in width with the spattered film of TiN/Al/Ti, as in the case of the 32 inch liquid crystal display panel, the film thickness of approximately 8500 Å is needed.

Here, it is possible to reduce the resistance of the wiring by increasing the thickness by of the spattered film of Tin/Al/Ti. This method however causes the following problems. Namely, the film thickness of the entire panel is increased. Further, an additional photolithography process is necessary. For this reason, in the present embodiment, an auxiliary line was formed by an inkjet method in which an auxiliary line material is ejected or dropped, so that the film thickness is increased only in a desirable portion of the wiring.

In order to form the auxiliary line by using the inkjet method described above, it is required to use a metal-containing fluid material (ink) in which nanoparticles of Ag or Au are dispersed. Such a metal-containing fluid material is dropped on a predetermined position of a substrate. Then, by performing calcination or the like, the metal contained in the material is left on the substrate, thus forming wiring or other components. The metal-containing fluid material may contain Pd, Pt, or the like, instead of Ag or Au. Considering the cost, Ag is reasonable among the above listed kinds of metal.

Further, when the material needs to have heat resistance, adherence to the glass substrate 13, or plasma resistance, it is preferable to use a material containing nanoparticles of an Ag alloy, which allows fabrication of wiring or an electrode having a high process resistance.

Wiring used in a liquid crystal panel is typically made of Al having a low resistance. In many cases, the wiring has such a structure that Ti and TiN are laminated, in consideration of tolerance and adhesiveness required in fabrication. However, since Ti and TiN have a higher resistance than that of Al, the resistance of the wiring is generally determined based on Al.

The specific resistance of Al is approximately 4 μΩ·cm, and the thickness is approximately 2000 Å. Thus, the surface resistance is approximately 0.2 Ω/□.

Thus, when forming the auxiliary metallic member in order to lower the resistance value of the wiring it must result in a decrease in surface resistance. It is meaningless if the resulting surface resistance of the wiring is higher than before the auxiliary metallic member is formed Further, it is preferred that the surface resistance of the portion on which the auxiliary metallic member is formed be lower than the surface resistance of wiring before the auxiliary metallic member is formed. When the surface resistance of the portion is higher than that of the wiring before the formation of the auxiliary metallic member, the resistance will decrease after the auxiliary metallic member is formed because the thickness increases. However, it is still preferable that the portion have a lower surface resistance in consideration of excessive increase in film thickness.

In this example, ink containing nanoparticles of Ag is used. This ink material contains a protection resin for preventing aggregation of fine particles of metal, and an organic substance serving as a solvent. A content of Ag in the ink material is approximately 50 wt %.

In the formation of the auxiliary line by the inkjet method using the foregoing ink containing the nanoparticles of Ag alloy, a calcination is carried out at 200° C. or higher after the material is applied, thereby decomposing the protection resin contained in the ink material. The resulting Ag wiring has a specific resistance of approximately 4 to 6 μΩ·cm. This value is slightly higher than an Ag film formed through vapor deposition. This is due to the organic constituent of the ink material.

With the foregoing method, wiring was formed on a portion of the main auxiliary capacitance line 16 in the 32 inch liquid crystal display panel. As in the case of forming the wiring by spattering, the resulting wiring was 40 cm in length and 800 μm in width. The thickness of the film was 3000 Å through one application and one calcination. and the resistance value was approximately 67 Ω.

Next, wiring having the foregoing resistance value is formed in the 45 inch liquid crystal display panel on its wiring formation region with a length of 56 cm. As in the case with the 32 inch liquid crystal display panel, the ink containing the nanoparticles of Ag was used for forming the wiring of 4200 Å in film thickness. As a result, there was formed the wiring having the same resistance value as that of the portion of the main auxiliary capacitance line 16 in the 32 inch liquid crystal display panel.

With the foregoing fabrication method of, resistance of wiring was decreased only by increasing the thickness, without an additional photolithography process in manufacturing of a liquid crystal display panel, and it is possible to increase the film thickness only for a desirable portion, leaving the thickness of the rest of the panel as such. This allows lowering of the resistance value of the desirable portion of the wiring.

In addition to this, the amount of wiring connected to the driver element 14 was reduced, and the width of the wiring was reduced without causing a change in the conventional resistance value, thereby (i) reducing a frame width of the liquid crystal display panel, and (ii) simplifying an external circuit board.

As described, since the width of the wiring can be reduced, it became possible to (i) reduce the width of the frame of the liquid crystal display panel, (ii) manufacture a new pattern in a newly created space nearby the liquid crystal display panel, or (iii) lower the resistance of the other portions of the wiring by increasing the width of the portion.

Next described is a manufacturing method of the active matrix substrate 10 in the liquid crystal display device of the present embodiment.

Figure 8:
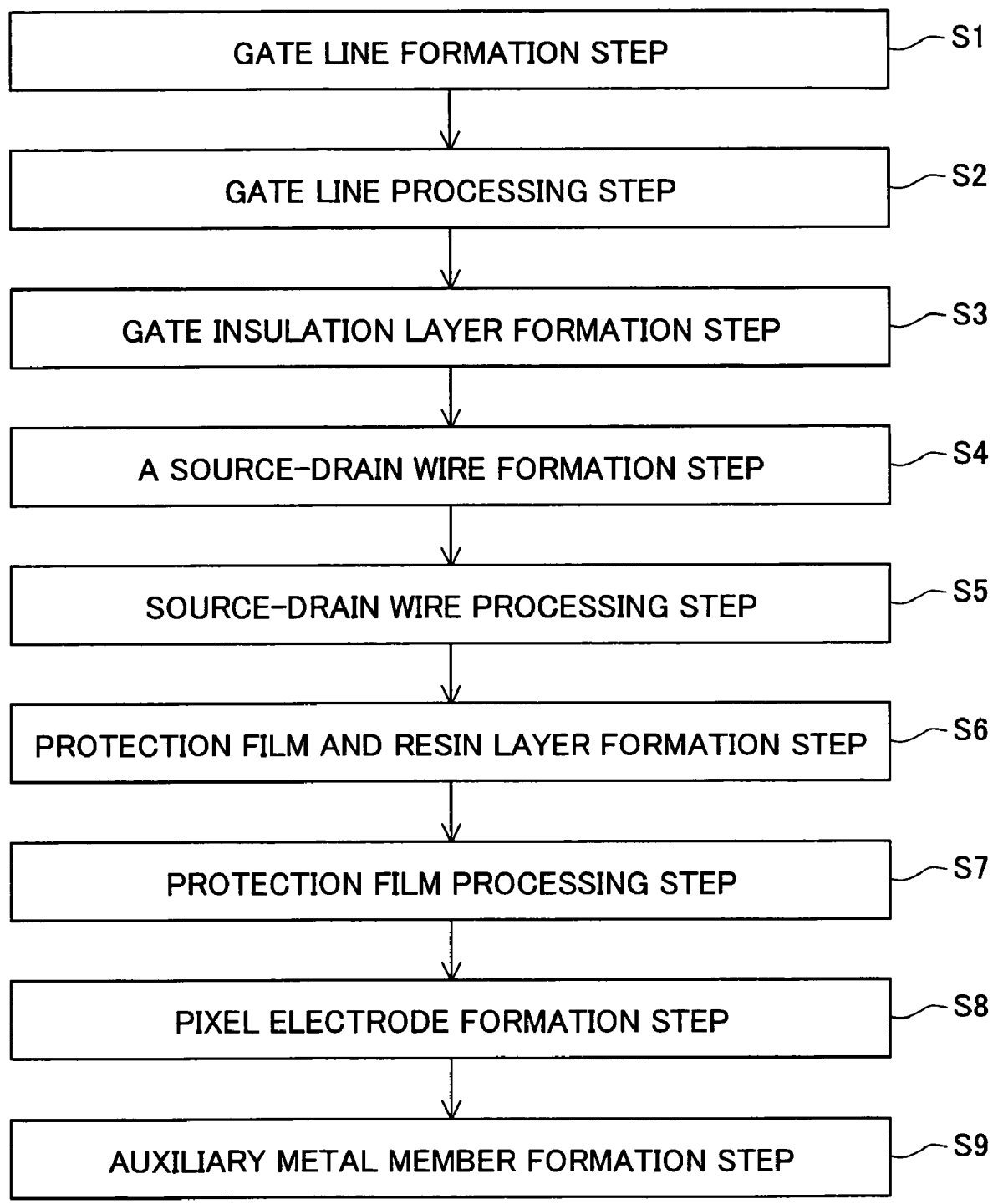
FIG. 8 is a flow chart showing a process of manufacturing the active matrix substrate.

As shown in FIG. 8, in the present embodiment, the active matrix substrate 10 is manufactured through: a gate line formation step S1; a gate line processing step S2; a gate insulation layer formation step S3; a source and drain lines formation step S4; a source and drain lines processing step S5; a protection film and resin layer formation step S6; a protection film processing step S7; a pixel electrode formation step S8; and an auxiliary metallic member formation step S9.

Figure 9:
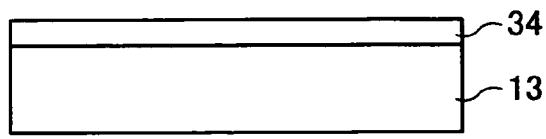
FIGS. 9(a) to 9(h) are cross sectional views illustrating a method of forming an auxiliary line in the active matrix substrate.
Figure 9:
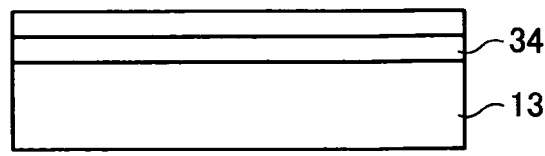
Figure 9:
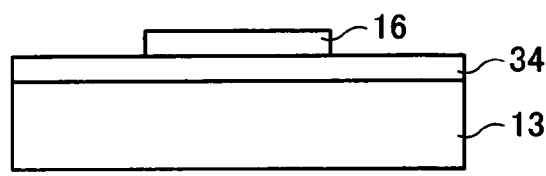
Figure 9:
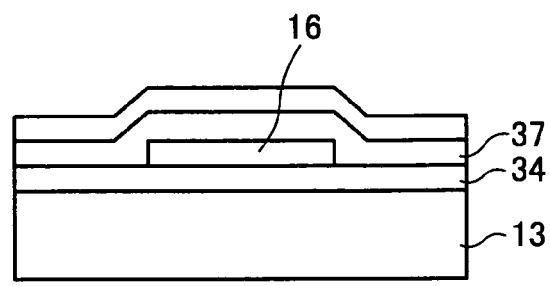
Figure 9:
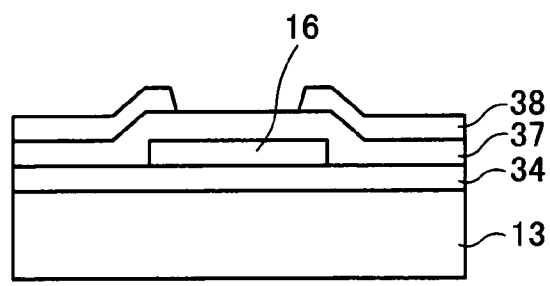
Figure 9:
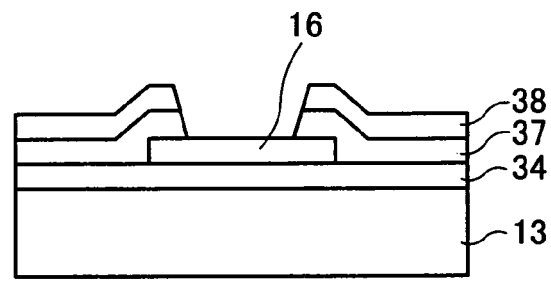
Figure 9:
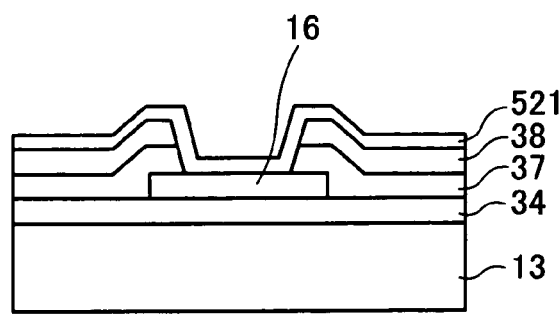
Figure 9:
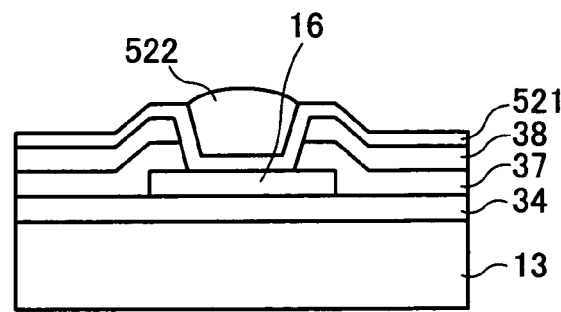

Note that the following description deals with a method for forming the auxiliary line 51 in the portion for the main auxiliary capacitance line 16. Further, FIG. 9 is a cross sectional view taken along the line B-B' in FIG. 4, illustrating the portion for the main auxiliary capacitance line 16.

[Gate Line Formation Step]

First, the following describes the gate line formation step S1. In the gate line formation step S1, a metallic film to serve as the gate line 31 is formed on the glass substrate 13 by the spattering method.

[Gate Line Processing Step]

Next, the following describes the gate line processing step S2. In the gate line processing step S2, a photolithography is carried out so as to pattern the metallic film formed in the gate line formation step S1, thereby forming the gate line 31. The gate line 31 is patterned by, for example, a dry etching method under $CF_4$ and $O_2$ gases.

[Gate Insulation Layer Formation Step]

The following describes gate insulation layer formation step S3. In the gate insulation layer formation step S3, the gate insulation layer 34 is formed on the glass substrate having been subjected to the gate line processing step S2. FIG. 9(a) illustrates the glass substrate 13 after the gate insulation layer formation step S2 is completed.

FIG. 9(a) is a cross sectional view taken along the line B'-B' in FIG. 4, showing a state of the gate insulation layer formation step S3 As the figure shows the state after the gate line material is removed by etching, the gate line 31 is not illustrated here.

Further, after the gate insulation layer 34 is formed on the glass substrate 13 having been subjected to the gate line formation step S1 and the gate line processing step S2, an amorphous silicon film serving as the amorphous silicon layer 23, and an n$^+$type silicon film serving as the n$^+$type silicon layer 24 are successively formed. The gate insulation layer 34 is made of a silicon nitride film. All of these films can be formed by a CVD (Chemical Vapor Deposition) method. Here, a photolithography process is carried out with respect to the amorphous silicon layer 23 and the n$^+$type silicon layer 24 for patterning the resist, and then a dry etching is carried out for processing these layers. However, these layers are removed by the etching, and are therefore omitted in FIG. 9(a).

[Source and Drain Lines Formation Step]

The following describes source and drain lines formation step S4. In the source and drain lines formation step S4, a metallic film, the material of the source line and the drain line, is formed on the gate insulation layer 34 by spattering. FIG. 9(b) is a cross sectional view illustrating a state after the source and drain lines formation step S4 is completed.

[Source and Drain Lines Processing Step]

The following describes source and drain lines processing step S5. In the source and drain lines processing step S5, a photolithography is carried out so as to pattern the metallic film formed in the source and drain lines formation step S4, thereby forming the source line and the drain line. Further, when these source/drain lines are formed by patterning a metallic film, the main auxiliary capacitance line 16 is formed at the same time from the metallic film in the predetermined portion denoted by "16" in FIG. 9(c). At this point, the source line, the drain line, and the main auxiliary capacitance line 16 are patterned by, for example, a dry etching under $CF_4$ and $O_2$ gases.

[Protection Film and Resin Film Formation Step]

The following describes protection film and resin film formation step S6. First, a silicon nitride film is formed to create the protection film 37 by a CVD method on the glass substrate 13 which has been processed by the foregoing steps. Then, on the silicon nitride film, a photosensitive acrylic resin material is applied (See FIG. 9(d)). After that, the photosensitive acrylic resin is patterned into the resin layer 38 through an exposure using a mask, development, and calcinations. As a result, the resin layer 38 having the predetermined pattern shown in FIG. 9(e) is formed.

[Protection Film Processing Step]

The following describes protection film processing step S7. In the protection film processing step S7, the silicon nitride film 37, which is formed in the protection film/interlayer insulation layer formation step S6, is etched by using the pattern of the resin layer 38. In this step, a dry etching was carried out under a mixed gas of $CF_4$ and $O_2$. FIG. 9(f) is a cross sectional view illustrating a state after the protection film processing step S7 is completed.

[Pixel Electrode Formation Step]

The following describes pixel electrode formation step S8. In the pixel electrode formation step S8, an ITO (Indium Tin Oxide) film is formed to create the pixel electrode 36 by spattering method. Then, the ITO film is pattered by photolithography, thereby forming the pixel electrode 36. At the same time of this, the guide layer 521 for the auxiliary line 52 in the portion of the main auxiliary capacitance line 16 shown in FIG. 9(g) is formed by patterning the ITO film.

In the meantime, in the portion of the main auxiliary

[Auxiliary metallic member Formation Step]

The following describes auxiliary metallic member formation step S9. In the auxiliary metallic member formation step S9, a material for the auxiliary metallic member 522 is applied to the guide layer 521 formed in a groove generated in the resin layer 38 and the protection layer 37, which have been formed on the main auxiliary capacitance line 16. The material for the auxiliary metallic member 522 is applied by using an inkjet apparatus or the like. Then, calcinations is carried out for evaporating the protection colloid, which is an organic substance contained in the material, thereby separating the metal contained in the material. Thus, the auxiliary metallic member 522 is formed.

Figure 10:
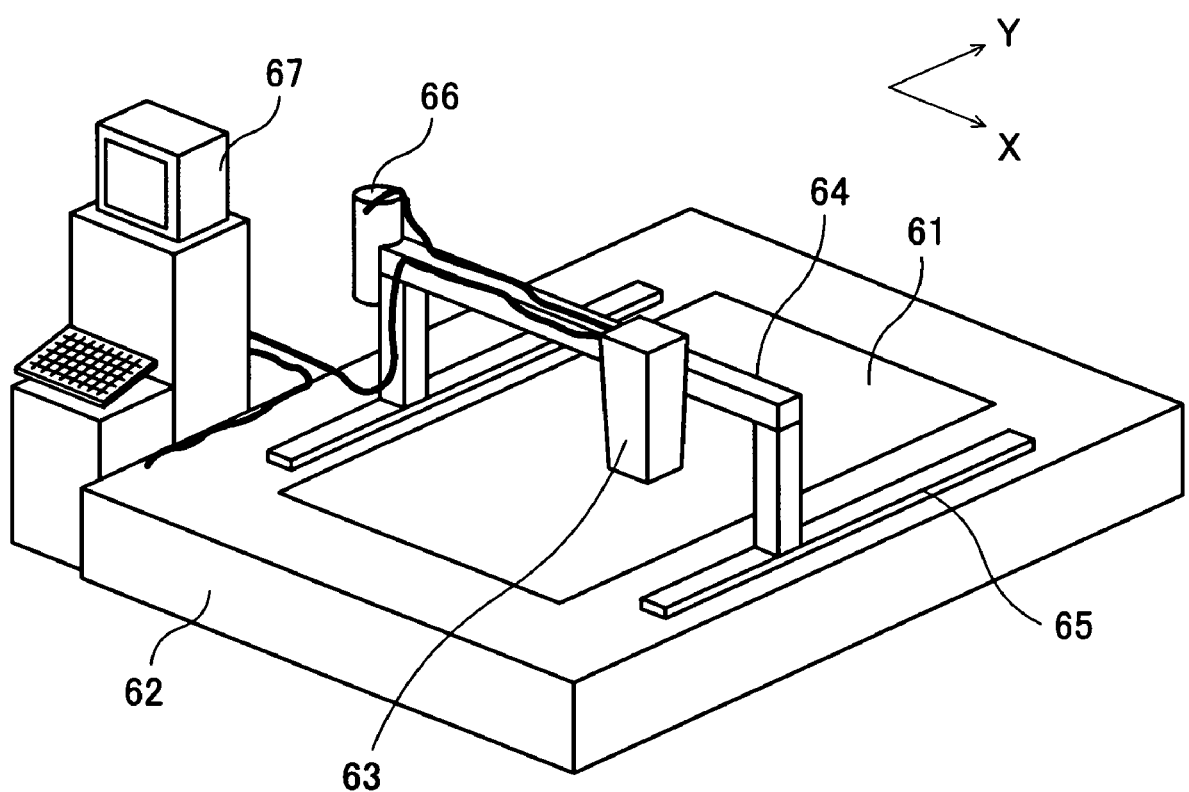
FIG. 10 is a perspective view showing a pattern formation apparatus for use in forming the auxiliary line in the active matrix substrate.

The method of the present embodiment for forming the auxiliary line uses a pattern formation apparatus such as an inkjet apparatus that ejects or drops a material for a layer to be formed. As shown in FIG. 10, such a pattern formation apparatus is provided with: a placing board 62 for placing thereon a substrate (corresponding to the foregoing glass substrate 13) 61; an inkjet head 63; an X-direction drive section 64 for causing the inkjet head 63 to move in the X-direction; and a Y-direction drive section 65 for causing the inkjet head 63 to move in the Y-direction. The inkjet head 63 ejects a droplet of fluid containing a wiring material or the like with respect to a substrate 61 on the placing board 62.

Further, the pattern formation apparatus is provided with: an ink supplying system 66 for supplying the fluid wiring material (ink) to the inkjet head 63; and a control unit 67 for carrying out various controls, such as an ejection control of the inkjet head 63, or drive controls of the X- and Y-direction drive sections 64 and 65. From the control unit 67, information for application position is outputted to the X- and Y-direction drive sections 64 and 65, and ejection information is outputted to a head driver (not shown) of the inkjet head 63. The inkjet head 63 is operated in synchronous manner with the X- and Y-direction drive sections 64 and 65, thereby supplying an arbitrary amount of the fluid wiring material to a target position on the substrate 61.

For example, the inkjet head 63 may be a piezo electric type using a piezo electric actuator, a bubble type having a heater, and so on. Amount of the ink ejected from the inkjet head 63 can be changed depending on the voltage being applied. Droplet ejecting means is not limited to the inkjet head 63 but may be but any means with a function of ejecting droplets. For example, it is possible to use droplet ejecting means only with a function of dropping liquid. Alternatively, it is possible to adopt an application or dipping method for patterning a the material into a certain shape, such as a method of previously forming on the substrate a lyophilic region and a lyophobic region with respect to the wiring material.

In the present embodiment, the auxiliary metallic members 512 and 522 are formed after the formation and processing of the ITO film, which is used for creating the pixel electrode 36 and the guide layers 511 and 521. In this case, if the material for the auxiliary metallic members is formed directly on the wiring material serving as foundation, the adhesiveness therebetween may be insufficient. Thus, by forming the guide layers 511 and 521 between the wiring material serving as the foundation and the material for the auxiliary metallic members, the adhesiveness will be improved. Further, the guide layers 511 and 521 made of the ITO is lyophilic, and therefore ease application of the material for the auxiliary metallic members 512 and 522.

The application of the material for the auxiliary metallic members 512 and 522 by the inkjet method was performed with an inkjet head ejecting a droplet of 5 pl for each application. The inkjet head ejects droplets onto respective bottom portions of the guide layers 511 and 521; i.e., the portions where the guide layers 511 and 521 meet the main auxiliary capacitance line 16 and the signal transmitting line 15. The droplet applied is a solvent in which the foregoing nanoparticles of Ag are dispersed in a colloid-manner. Each grain of the nanoparticles is bonded with an organic substance.

Here, the gate insulation layer 34 is 3000 Å in thickness, and the protection film 37 is 3000 Å in thickness. The resin layer 38 formed on the protection film 37 has a thickness of 3 μm. Accordingly, a guide of 3.6 μm in thickness exists along the main auxiliary capacitance line 16 in the position where the auxiliary metallic members 512 and 522 are formed.

A content of metal in the liquid being applied is 50 wt %, which is equivalent to 9% when converted into a volume ratio. The application was so carried out that the liquid applied does not flood over a groove made through the protection film 37 and the resin film 38, and therefore the groove is substantially filled up by the liquid. Then, the solvent and the organic substance surrounding the nanoparticles are removed by heating at 200° C. in an air oven, thereby obtaining a metal solid. Thus, the organic substance has been removed from the liquid having been applied, and a film of 3000 Å in thickness is formed. A volumetric resistance value of the auxiliary metallic members 512 and 522 formed by this application was 4 to 6 μΩ·cm.

If necessary, the film thickness can be increased by (i) further applying the liquid on the calcined or dried solvent, and (ii) then separating a metal solid. In this manner, by forming a film of 3000 Å in thickness on the calcined solvent, and repeating the application and the calcination in the same manner, a film of 6000 Å in total thickness can be formed.

In the meantime, in order to protect the auxiliary metallic members 512 and 522, the inkjet method can be used likewise, i.e., applying protective resin such as ultraviolet curable resin on the auxiliary metallic members 512 and 522.

Further, the method of the present embodiment for forming the auxiliary line is also applicable to the signal transmitting line 15 for use in connecting the driver elements 14.

The following describes formation of the auxiliary line 51 with respect to the signal transmitting line 15, with reference to FIGS. 11(a) and (b). FIG. 11(a) is a cross sectional view taken along the line C-C' in FIG. 7(a), illustrating the signal transmitting line 15 provided with the auxiliary line 51.

Figure 11:
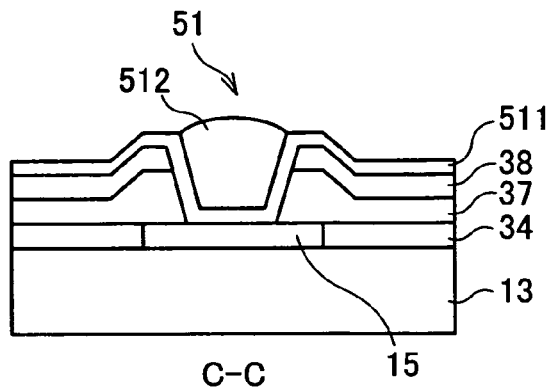
FIG. 11(a) is a cross sectional view taken along the line C-C' in FIG. 7(a), illustrating the signal transmitting line on which the auxiliary line is formed.
FIG. 11(b) is a cross sectional view taken along the line E-E' in FIG. 7(a), illustrating the signal transmitting line.
Figure 11:
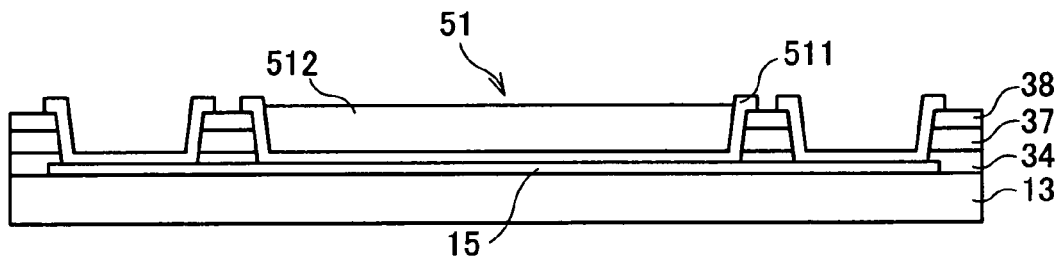

As shown in FIG. 11, the signal transmitting line 15 is formed on the glass substrate 13. Further, the gate insulation layer 34, protection layer 37, and resin layer 38 are formed on the signal transmitting line 15. Above the signal transmitting line 15, a groove is formed through the gate insulation layer 34, the protection layer 37, and the resin layer 38. In this groove, there is formed the auxiliary line 51 which includes the guide layer 511 and the auxiliary metallic member 512.

Further, FIG. 11(b) is a cross sectional view taken along the line E-E' in FIG. 7(a), illustrating the signal transmitting line 15. In some cases, the auxiliary line 51 is formed on the entire signal transmitting line 15, but there is also a case where the auxiliary line 51 is formed avoiding a terminal section of the signal transmitting line 15 as shown in FIG. 11(b).

With the use of the auxiliary line 51, the resistance value of the signal transmitting line 15 is lowered along with an increase in the film thickness of the signal transmitting line 15. This makes it possible to reduce the width of the signal transmitting line 15 while keeping the same resistance value of the wiring, thereby reducing the width of the panel frame is reduced. Further, in the case of an active matrix substrate driven by an external driver it is possible to simplify the external circuit board by forming the signal transmitting line 15 on the active matrix substrate 10.

Figure 12:
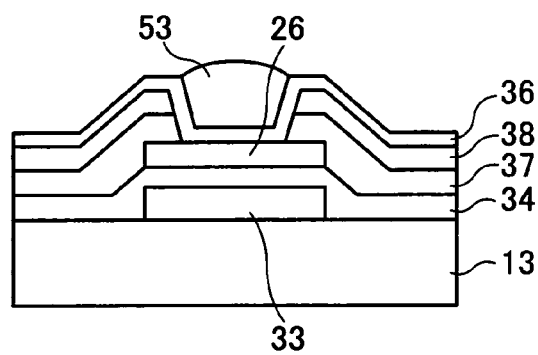
FIG. 12 is a cross sectional view taken along the line F-F' in FIG. 3(a), illustrating a contact hole on which an auxiliary metallic member is formed.

Next described, with reference to FIG. 12, is an auxiliary metallic member formed in the contact hole for connecting the drain line to the pixel electrode in the image forming region 11 of the active matrix substrate 10. FIG. 12 is a cross sectional view taken along the line F-F' in FIG. 3(a), illustrating an auxiliary metallic member 53 formed in the contact hole 35

As shown in FIG. 12, in the portion where the contact hole 35 is perforated, the auxiliary capacitance line 33 is formed on the glass substrate 13. The drain electrode line 26 is formed on the auxiliary capacitance line 33 via the gate insulation layer 34. Further, the protection layer 37 and the resin layer 38 are formed on the drain electrode line 26. The contact hole 35 is perforated in the protection layer 37 and the resin layer 38 which are formed on the drain electrode line 26. In this contact hole 35, the auxiliary metallic member 53 is provided. Further, the drain electrode line 26 and the pixel electrode 36 are connected with each other via the contact hole 35.

The thickness of wiring in the contact hole 35 is increased due to the auxiliary metallic member 53 formed therein. Accordingly, the resistance between the pixel electrode 36 and the drain electrode line 26 are lowered.

Figure 13:
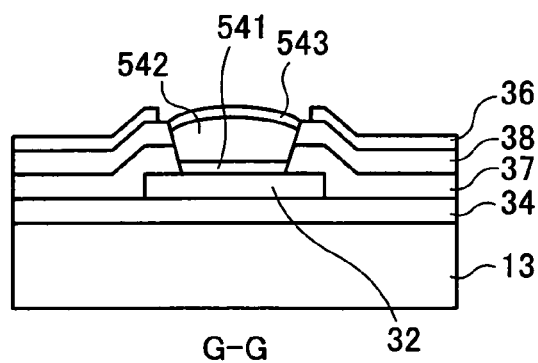
FIG. 13 is a cross sectional view taken along the line G-G' in FIG. 3(a), illustrating a source wiring on which the auxiliary line is formed.

Next described with reference to FIG. 13 is a formation of an auxiliary metallic member with respect to the source line 32 in the image forming region 11 of the active matrix substrate 10. FIG. 13 is a cross sectional view taken along the line G-G' in FIG. 3(a), and is illustrating the source line 32 being provided with an auxiliary line 54.

As shown in FIG. 13, the source line 32 is formed on the glass substrate 13 via the gate insulation layer 34. On the source line 32, the protection layer 37 and the resin layer 38 are formed. A groove is formed through the protection layer 37 and the resin layer 38 on the source line 32. In this groove, the auxiliary line 54 is formed. This auxiliary line 54 includes: (i) an ITO film 541 formed together with the pixel electrode 36; and (ii) an auxiliary metallic member 542. Further, after the auxiliary metallic member 542 is formed, an insulation film 543 may be formed over the auxiliary metallic member 542 so as to protect the auxiliary metallic member 542. In the formation of the auxiliary metallic member 542, the photosensitive resin layer 38 is preferably processed by a dry etching or the like to become lyophobic. This allows easier application of a material for the auxiliary metallic member 542 on a narrow portion of the source line 32. Further, in the example shown in FIG. 13, the ITO film 541, which is formed together with the formation of the pixel electrode 36, is formed below the auxiliary metallic member 542. This ITO film 541 may be formed above the auxiliary metallic member 542 so as to protect the auxiliary metallic member 542, instead of the insulation film 543.

The foregoing method for forming the auxiliary metallic member improves the adhesiveness between conventional wiring and the auxiliary metallic member. Further, in order to simplify the application of the material for the auxiliary metallic member, the auxiliary metallic member is formed above an ITO film (guide layer or the like) formed together with the pixel electrode 35. However, in a case where the material for the auxiliary metallic member is not sufficiently tolerant, the ITO film can be used to protect the auxiliary metallic member. In such a case, the pixel electrode formation step is carried out after the auxiliary metallic member is formed.

Figure 14:
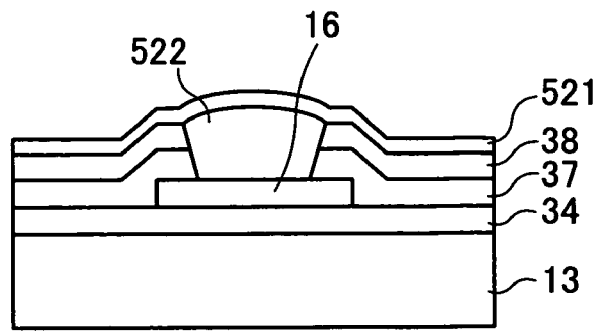
FIG. 14(a) is a cross sectional view illustrating the auxiliary line of the signal transmitting line when a pixel electrode formation step is carried out after the auxiliary metallic member formation step is carried out.
FIG. 14(b) is a cross sectional view illustrating the auxiliary line of the signal transmitting line when a pixel electrode formation step is carried out after the auxiliary metallic member formation step is carried out.
FIG. 14(c) is cross sectional view illustrating the auxiliary line provided to the contact hole for connecting a drain line with the pixel electrode, when a pixel electrode formation step is carried out after the auxiliary metallic member formation step is carried out.
Figure 14:
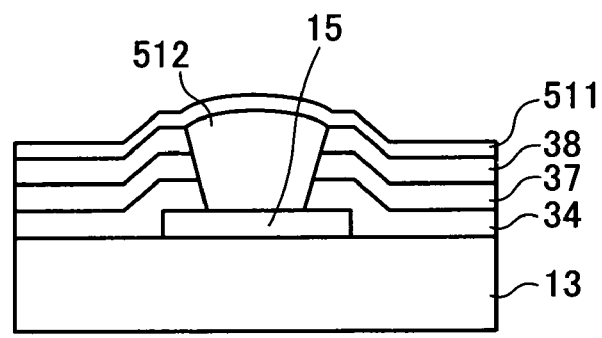
Figure 14:
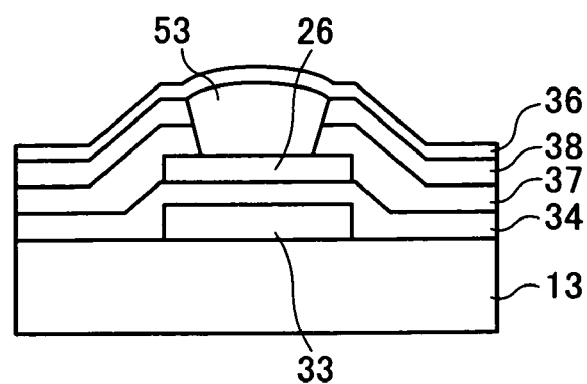

Each of FIGS. 14(a) to 14(c) illustrates a case where the pixel electrode formation step is carried out after the auxiliary metallic member formation step is carried out. FIG. 14(a) is a cross sectional view illustrating the auxiliary line 52 formed on the main auxiliary capacitance line 16, FIG. 14(b) is a cross sectional view illustrating the auxiliary line 51 formed on the signal transmitting line 15, and FIG. 14(c) is a cross sectional view illustrating the auxiliary metallic member 53 formed in a contact hole for connecting the drain electrode line 26 and the pixel electrode 36 with each other.

Further, though the present embodiment has described a case where the auxiliary metallic member is formed in the groove formed through the protection layer 37 and the resin layer 38 using an apparatus, such as an inkjet apparatus for applying the material for the auxiliary metallic member in the groove, the method for forming the auxiliary metallic member is not limited to this, provided that the material for the auxiliary metallic member is separately applied. For example, a substrate may be provided with a lyophilic region and a lyophobic region. In this case, the auxiliary metallic member may be formed by applying the material for the auxiliary metallic member only to the lyophilic region.

Figure 15:
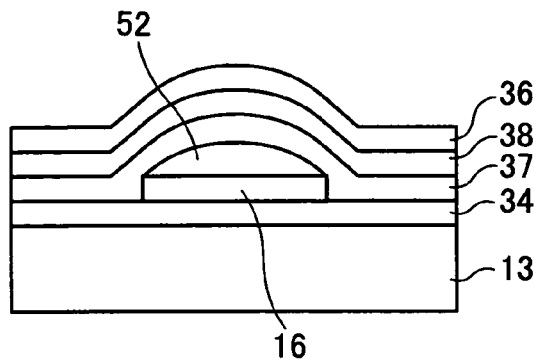
FIG. 15(a) is a cross sectional view illustrating the main auxiliary capacitance line after the auxiliary metallic member formation step is carried out.
FIG. 15(b) is a cross sectional view illustrating the signal transmitting line after the auxiliary metallic member formation step is carried out.
FIG. 15(c) is a cross sectional view illustrating the contact hole for use in connecting the drain line with the pixel electrode after the auxiliary metallic member formation step is carried out.
FIG. 15(d) is a cross sectional view illustrating the source line after auxiliary metallic member formation step is carried out.
Figure 15:
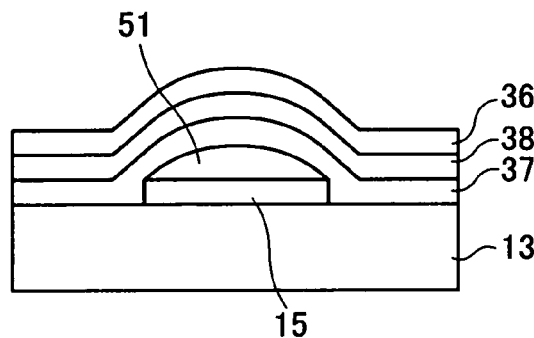
Figure 15:
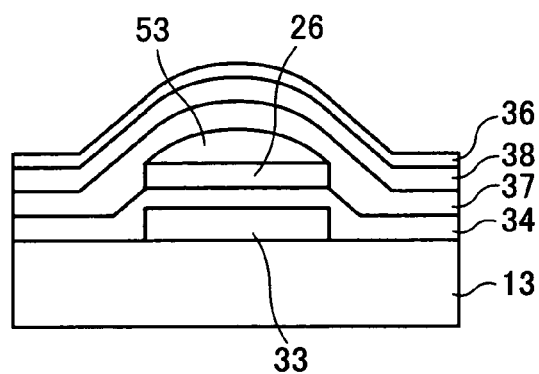
Figure 15:
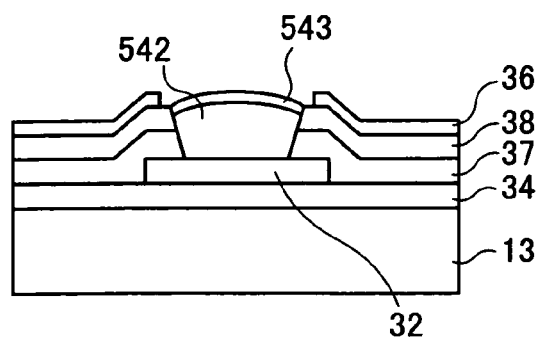

In each of FIGS. 15(a) to 15(d), there is shown a case where the auxiliary metallic member is formed by a method in which (i) the lyophilic region and the lyophobic region are provided on a substrate, and (ii) the material for the auxiliary metallic member is applied only to the lyophilic region. Each figure illustrates a state after the auxiliary metallic member formation step is carried out. FIG. 15(a) is a cross sectional view illustrating the auxiliary line 52 formed on the main auxiliary capacitance line 16, FIG. 15(b) is a cross sectional view illustrating the auxiliary line 51 formed on the signal transmitting line 15, FIG. 15(c) is a cross sectional view illustrating the auxiliary metallic member 53 formed in a contact hole for connecting the drain electrode line 26 with the pixel electrode 36, and FIG. 15(d) is a cross sectional view illustrating the auxiliary line 54 formed on the source line 32.

In the foregoing auxiliary metallic member formation step, the auxiliary metallic member is formed as follows. Namely, the material for the auxiliary metallic member is applied on the lyophilic region (the gate line 31 or the source line 32) by using an apparatus such as an inkjet apparatus. Then, the protection layer 37, the resin layer 38, and the pixel electrode 36 are formed thereon by the foregoing method.

Figure 16:
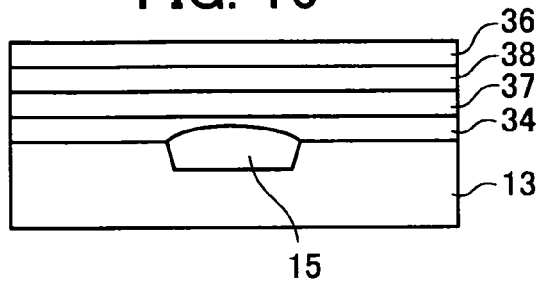
FIG. 16 is a cross sectional view illustrating a formation of the auxiliary line on the signal transmitting line.

Further, FIG. 16 shows an alternative method for carrying out the formation of the auxiliary line with respect to the signal transmitting line 15.

As shown in FIG. 16, an etching is carried out with respect to the glass substrate 13, so as to form a groove in a portion where the signal transmitting line 15 is to be formed. By applying, in this groove, the material for the auxiliary metallic member, the signal transmitting line 15 is formed. With this method, the resulting signal transmitting line 15 becomes thicker, and therefore, the signal transmitting line 15 can also serves as the auxiliary line. In this case, a pattern is formed beforehand using a resist. Then, the groove is formed on the glass substrate 13 by carrying out a dry etching using $CF_4+O_2$, or a wet etching.

Further, after the dry etching is carried out, the glass substrate 13, on which the resist still remains, may be dipped into diluted hydrofluoric acid. This causes the groove on the glass substrate 13 to become lyophilic with respect to the material for the auxiliary metallic member. Then the material for the auxiliary metallic member may be applied in the groove. In this case, the surface of the resist is also subjected to fluorine treatment using $CF_4$. As such, the resist portion repels the liquid being applied. This allows easier application of the material for the auxiliary metallic member in the groove formed on the glass substrate 13.

Then, the resist is peeled off after the auxiliary metallic member is calcined or dried. On the auxiliary metallic member, an ITO film to become the protection film 37, the resin layer 38, and the pixel electrode 36 are formed.

Figure 20:
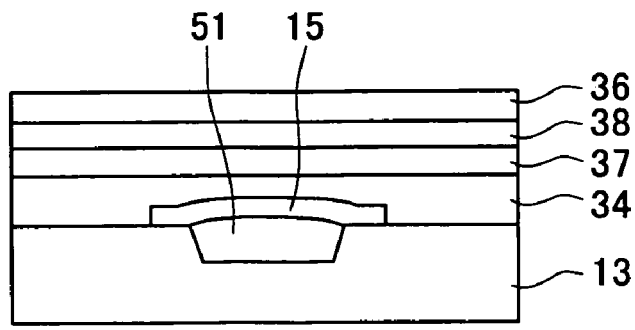
FIG. 20 is a cross sectional view illustrating another example of the auxiliary line formed on the signal transmitting line.

Moreover, as shown in FIG. 20, it is also possible to first (i) form the groove on the glass substrate 13; then (ii) apply the material for the auxiliary metallic member 51; and then (iii) form a wiring pattern of the signal transmitting line 15 by a spattering method or a deposition method. As described, this example allows the formation of the wiring pattern of the signal transmitting line 15 on the auxiliary metallic member 51 after the formation of the auxiliary metallic member 51, in contrast to the preceding example in which the auxiliary metallic member 51 is provided on the wiring pattern.

In this case, when the auxiliary metallic member whose resistance is low is first poured into the groove to form low resistance wiring, and then, a metal highly tolerant to processing, such as Ti, is applied over the auxiliary metallic member, reliability of wiring can be improved. Further, it is also possible to reduce the process time and material cost by reducing the film thickness of each film in the spattering method or the deposition method.

Further, the foregoing method, in which the low resistance wiring is formed in the groove formed on the glass substrate 13, is also applicable to a formation of a gate line, an auxiliary capacitance line, or the like, in addition to the signal transmitting line 15, provided that wiring is directly formed onto the glass substrate 13. The following describes, with reference to FIGS. 22(a) to 22(c), examples of using the foregoing method for forming low resistance wiring in a groove of the glass substrate 13 to a formation of a gate line, and to a formation of an auxiliary capacitance line.

Figure 22:
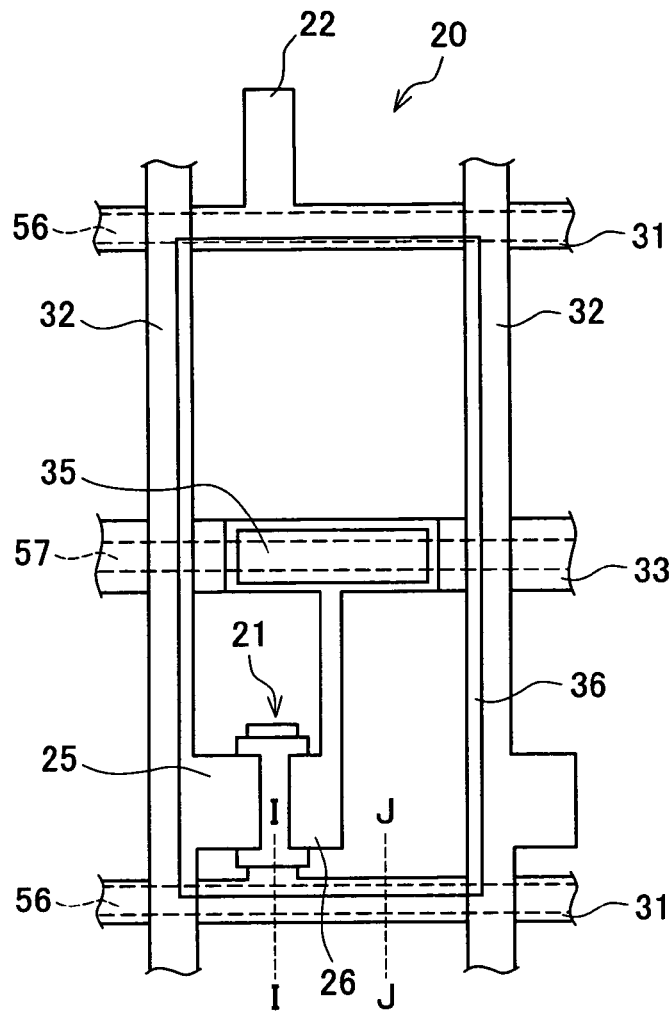
FIG. 22(a) is a plane view illustrating an alternative form of the active matrix substrate shown in FIG. 3(a).
FIG. 22(b) is a cross sectional view taken along the line I-I' in FIG. 22(a).
FIG. 22(c) is a cross sectional view taken along the line J-J' in FIG. 22(a).
Figure 22:
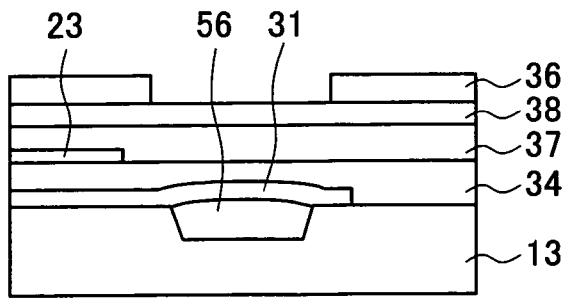
Figure 22:
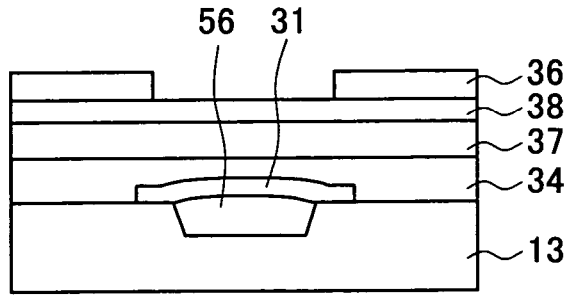

In a configuration shown in FIGS. 22(a) to 22(c), the gate line 31 and the auxiliary capacitance line 33 are formed as follows. Namely, the glass substrate 13 is provided with grooves in (i) a position where the gate line 31 is to be formed, and (ii) a position where the auxiliary capacitance line 33 is to be formed. To these grooves, fluid containing fine particles of metal (material for an auxiliary metallic member is applied by application, ejection or the like. The metal contained in the fluid is separated out from the fluid through calcination, thereby forming the auxiliary lines 56 and 57. Above these auxiliary lines 56 and 57, a conductive film is formed by spattering, thereby completing the gate line 31 and the auxiliary capacitance line 33. In FIG. 22(a), the auxiliary line 56 serves as an auxiliary line for the gate line 31, and the auxiliary line 57 serves as an auxiliary line formed for the auxiliary capacitance line 33.

Those grooves on the glass substrate 13 are formed by dry etching. After the dry etching is carried out, it is possible to carry out a lyophilic treatment with respect to the glass substrate 13, on which the resist used in the dry etching still remains, by dipping the glass substrate 13 into diluted fluoric acid. The material for the auxiliary metallic member may be applied to the grooves after this lyophilic treatment. In this case, the resist repels the material for the auxiliary metallic member. This is because the resist is given an effect (lyophobic effect) similar to the fluorine treatment because of $CF_4$ used in the foregoing dry etching. This allows easier application of the material for the auxiliary metallic member in the groove.

After the formation of the gate line 31 and the auxiliary capacitance line 33, the gate insulation layer 34, the protection layer 37, the resin layer 38, the pixel electrode 36, or the like is formed, in a predetermined order, with a predetermined pattern. FIG. 22(b) is a cross sectional view taken along the line I-I' in FIG. 22(a), illustrating a portion of the gate line including the gate electrode. Further, FIG. 22(c) is a cross sectional view taken along the line J-J' in FIG. 22(a), illustrating a portion of the gate line not including the gate electrode.

In the foregoing example illustrated in FIGS. 22(a) to 22(c), the auxiliary lines 56 and 57 are formed by (i) forming the grooves on the glass substrate 13, (ii) applying the material for the auxiliary metallic member in the grooves, and (iii) carrying out calcination. In this case, the resistance of the auxiliary lines 56 and 57 are reduced by increasing the depths of the grooves and reducing the widths of the grooves. Thus, it is possible to (i) form low resistance wiring, serving as the gate line 31 or the auxiliary capacitance line 33, and (ii) avoid reduction in aperture ratio of the active matrix substrate.

Further, since the auxiliary lines 56 and 57 are formed in the respective grooves formed on the glass substrate 13, the gate line 31 and the auxiliary capacitance line 33 are decreased in resistance without being increased in thickness in view of the plane of the glass substrate 13. More specifically, it is possible to prevent a level difference in a portion where the gate line 31 and/or the auxiliary capacitance line 33 meet wiring (signal line, scanning line or the like) in an upper layer, which level difference occurs due to an increase in the film thickness of the gate line 31 or of the auxiliary capacitance line 33 Consequently, it is possible to prevent breakage of the wiring in the upper layer due to the level difference.

After the formation of the auxiliary lines 56 and 57, the conductive spattered-film (i.e., the gate line 31 or the auxiliary capacitance line 33) formed on the auxiliary lines 56 and 57 serves as cap metal for the auxiliary lines 56 and 57. This cap metal, in a later process, keeps the auxiliary lines 56 and 57 from being directly exposed to an etching gas, peeling agent, or the like. Accordingly, tolerance to processing is improved.

The foregoing configuration has some difficulties in processing the thin wiring which branches off from the gate line 31 (e.g. gate electrode), for example, in a portion where the gate line is formed, there is some difficulties in processing the tapered shape which is formed when the etching is carried out to form the grooves on the glass substrate 13. Further, the auxiliary line 56, formed by calcinating the fine particles of metal, is softer and more easily damaged than the gate line 31 formed by spattering. Further, it is difficult to avoid generation of an edge on the end of the groove even when the auxiliary metallic member is provided in the groove. Therefore, if attempting to form a TFT in which thin films are laminated, on the auxiliary line the films may break, thus causing negative influence to properties of the TFT. Accordingly, it is preferable that the auxiliary line 56 be not formed in a portion where the gate electrode is formed, and that the gate electrode be formed from a spattered-film with a desirable flatness.

Figure 23:
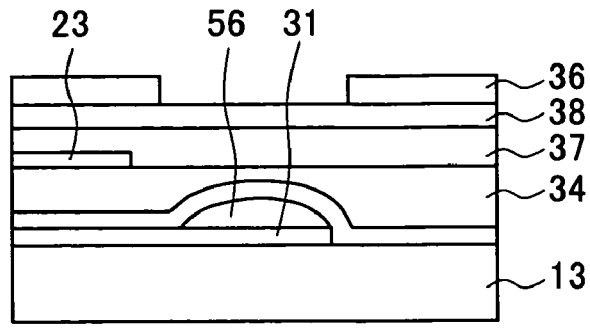
FIG. 23 is a plane view illustrating an alternative form of a portion of gate line in the active matrix substrate.

Further, in the foregoing configuration, the thin wiring or the electrode branching off from the gate line 31 is formed from the spattered-film. Since the auxiliary line 56 is not formed in the portion where the gate electrode is formed, the groove where the auxiliary line 56 is to be formed becomes substantially a simple linear shape. Accordingly, when compared to a case where the auxiliary line 56 is also formed in the portion where the wiring being branched off, the formation of the grooves and application of the material for the auxiliary metallic member become easier. Not only to the case of the foregoing groove structure, but also to a case shown in FIG. 23 where the auxiliary line 56 is formed above the gate line 31, formation of the auxiliary line 56 in a portion of the gate electrode is not necessary for the same reason.

Figure 24:
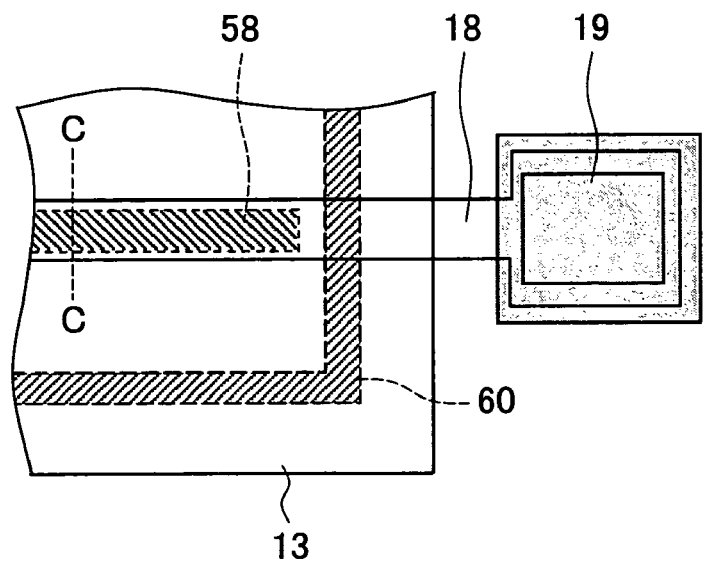
FIG. 24(a) is a plane view illustrating a signal transmitting line for connecting wiring in a displaying section of the active matrix substrate with a connection terminal.
FIG. 24(b) is a cross sectional view illustrating the signal transmitting line for connecting the wiring in the displaying section of the active matrix substrate with the connection terminal.
Figure 24:
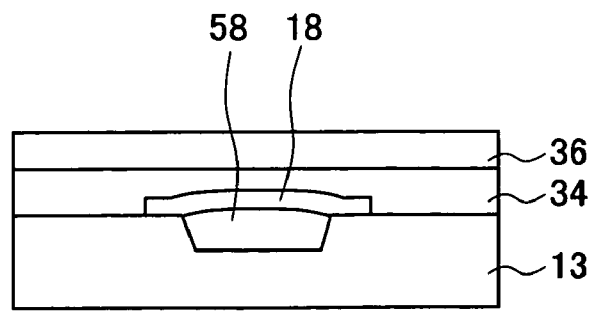

Further, FIGS. 24(a) and 24(b) illustrate an application of the foregoing configuration to an active matrix substrate. In this example, the low-resistance wiring 58 is formed in a groove of a glass substrate 13 of a signal transmitting line 18 for connecting the wiring in a display region with a panel connection terminal 19.

In this case, it is difficult to form the groove in a portion where the terminal section 19 is to be formed, as in the case of forming the auxiliary line 56 with respect to the gate line 31. Further, since the auxiliary line 58 is formed from a relatively soft material, the auxiliary line 58 may be peeled off from the terminal section 19 even if the terminal section 19 is externally conducted, thereby decreasing reliability. In view of these problems, it is preferable that the terminal section 19 be formed from a spattered-film, and the auxiliary line 58 is formed on the rest of the portion.

Note that in a case where the auxiliary line 58 having the foregoing groove configuration is applied to a TFT substrate of a liquid crystal panel, it is preferable that the auxiliary line 58 be formed inside the sealing material 60 for combining the TFT substrate and a counter substrate. This is because, if the auxiliary line 58 overlaps the sealing material 60 for combining these substrates, an extra stress is applied to the auxiliary line 58 and the sealing material 60. This extra stress may result in detachment of the auxiliary line 58, or insufficient sealing when the substrates are combined In view of the foregoing problem, it is preferable that the terminal section 19, which is provided outside the sealing material, is constituted only of a spattered-film.

Figure 3:
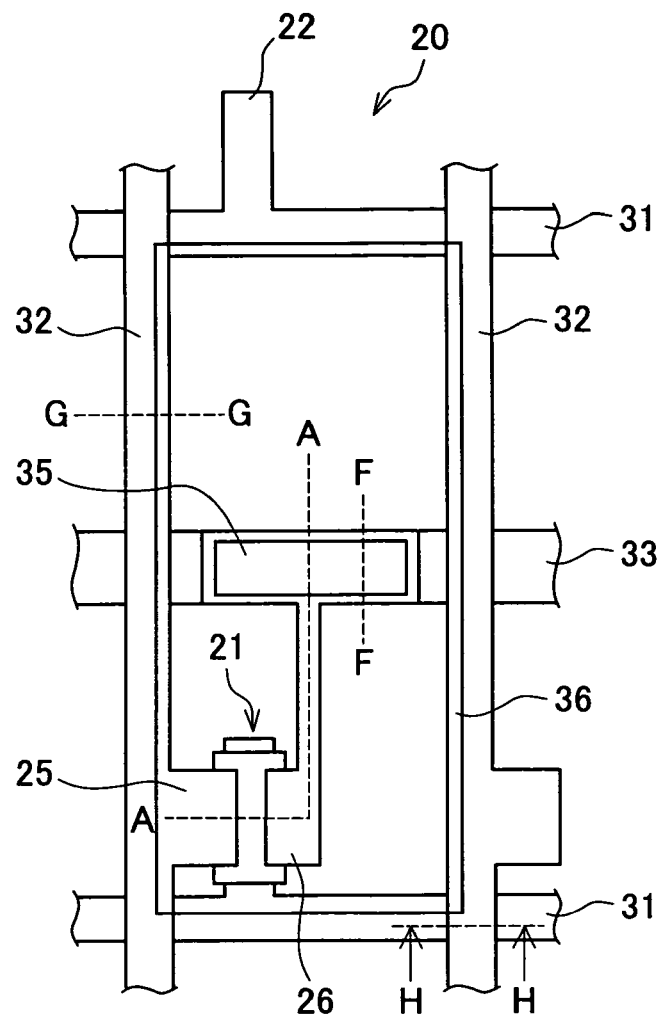
FIG. 3(a) is a plane view illustrating a configuration of a pixel of the active matrix substrate.
FIG. 3(b) is a cross sectional view illustrating the configuration of the pixel of the active matrix substrate
Figure 3:
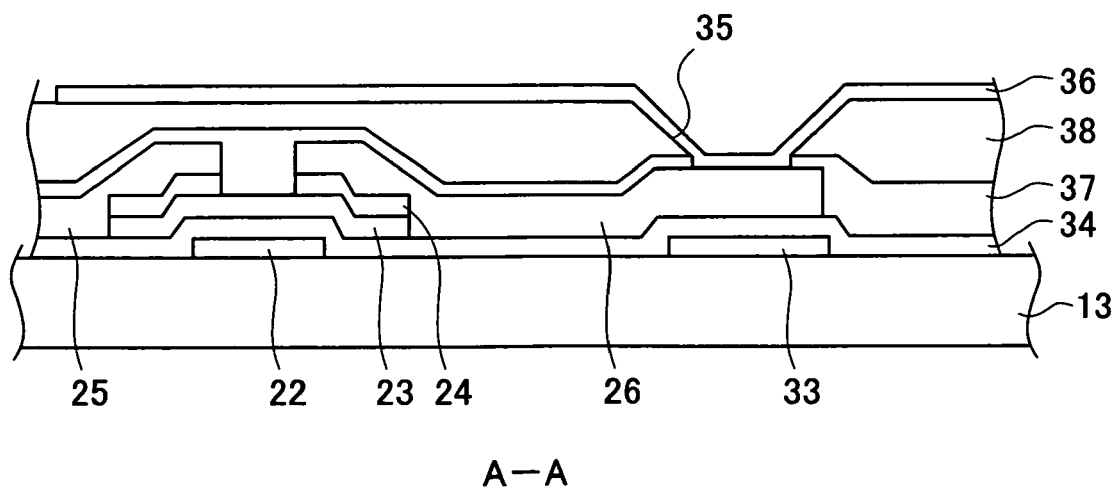
Figure 17:
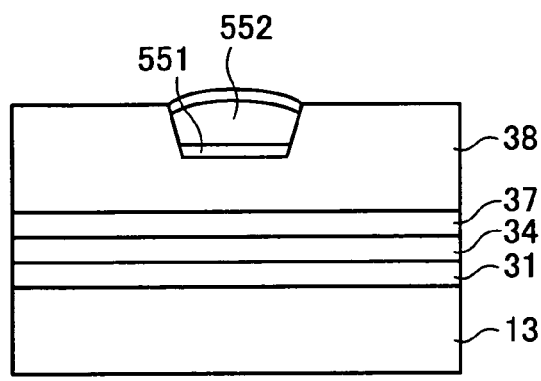
FIG. 17 is a cross sectional view taken along the line H-H' in FIG. 3, illustrating a source-gate intersecting section being subjected to the formation of the auxiliary metallic member.

Further, it is possible to use the present invention for forming an auxiliary metallic member in a source-gate intersecting section (a section where the source line 32 and the gate line intersect with each other), so as to reduce a capacitance of the source-gate intersecting section in the TFT. The following describes formation of an auxiliary metallic member in the source-gate intersecting section, with reference to FIG. 17. FIG. 17 is a cross sectional view taken along the line H-H' in FIG. 3, illustrating a source-gate intersecting section in which an auxiliary metallic member is formed.

As shown in FIG. 17, in the source-gate intersecting section, the gate line 31, the gate insulation layer 34, the protection layer 37, and the resin layer 38 are formed in this order on the glass substrate 13. An ITO film 551 is formed in a groove formed on the resin layer 38 together with the formation of the pixel electrode 36. On this ITO film 551, an auxiliary metallic member 552 is formed by an inkjet method. Note that the source electrode in the TFT 21 is formed in a layer above the gate insulation layer 34; i.e., below the protection layer 37 and the resin layer 38. In the formation of the source electrode, patterning is so carried out as to form only the source electrode (the entire source line 32 is not formed at this point). In other word, the example shown in FIG. 17, the wiring constituted of the auxiliary metallic member 552 serves as the source line 32. The source line 32 constituted of the auxiliary metallic member 552 is connected with the source electrode previously formed in the TFT 21, via a contact hole (not shown) perforated through the gate insulation layer 34, the protection layer 37, and the resin layer 38.

Further, when patterned by photolithography, the resin layer 38 is half-exposed so that the resin layer 38 remains except for the contact portion with the source line 32. Further, in the formation of the auxiliary metallic member 552, a lyophobic treatment is carried out by dry etching or the like so as to (i) make the photosensitive resin layer lyophobic, and (ii) make the pixel electrode lyophilic. This allows easier application of a material for the auxiliary metallic member 552.

As described, by carrying out the half exposure with respect to the resin layer 38 which is the material for low resistance wiring, the resin layer 38 is left in the position where the gate line 31 intersects with the auxiliary metallic member 552 which becomes the source line 32. This enables the reduction of (i) the capacitance in the source-gate intersecting portion, and reduction of (ii) delay of transmitting signals to the panel.

Figure 18:
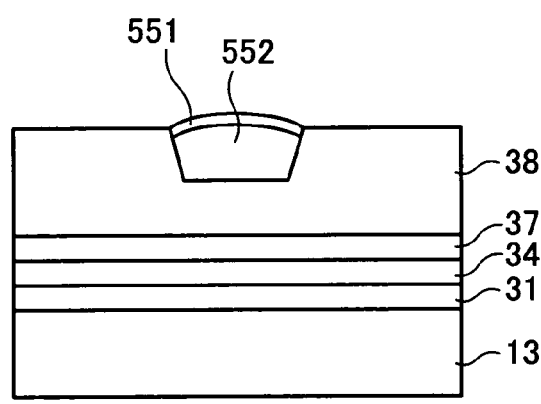
FIG. 18 is a cross sectional view illustrating another example of the auxiliary metallic member formed on the source-gate intersecting section.
Figure 19:
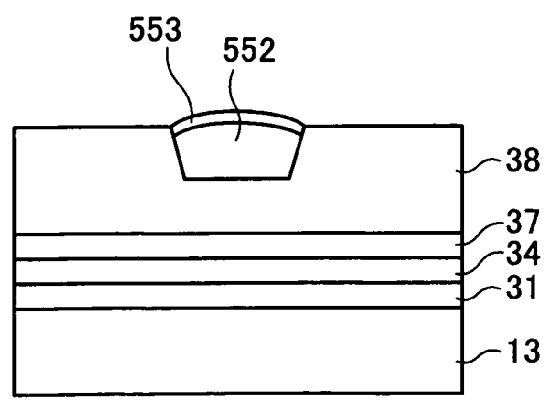
FIG. 19 is a cross sectional view illustrating yet another example of the auxiliary metallic member formed on the source-gate intersecting section.

Further, when forming the 552, it is not necessary to form the ITO film 551 as the base, but the ITO film 551 or an insulation film 553, which becomes the protection film, may be formed after (i) the groove in the resin layer 38 is formed by carrying out the half exposure, and (ii) the auxiliary metallic member 552 is formed in the groove by carrying out the inkjet method, as shown in FIGS. 18 and 19. With this configuration, protection of the auxiliary metallic member is ensured.

By using the auxiliary metallic member as the source line, the resistance of the source line is lowered. This configuration also has the following merit.

A general liquid crystal display panel employs two driving methods: (i) a method of driving source signals by a source driver mounted on one end of a substrate; and (ii) a parted driving method in which the source driver is mounted on both ends of the substrate. In the parted driving method, a display region is divided into an upper region and a lower region. The source driver on the upper end of the substrate drives the upper region of the display region, and the source driver on the lower end of the substrate drives the lower region of the display region.

Figure 21:
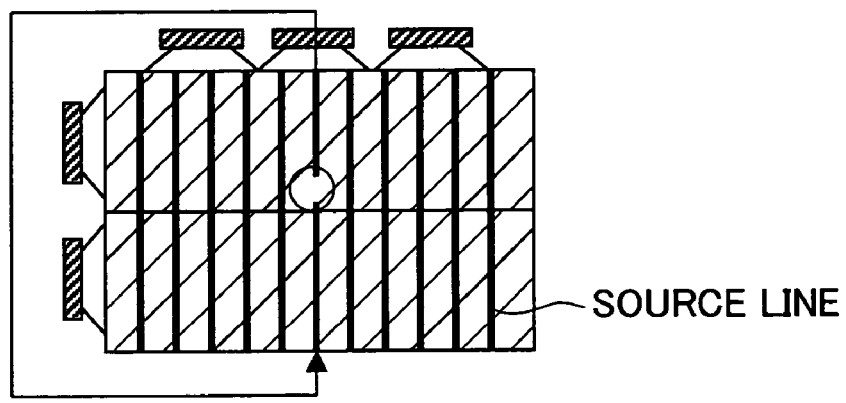
FIG. 21(a) is a plane view illustrating a schematic configuration of a liquid crystal display panel driven by using a typical method.
FIG. 21(b) is a plane view illustrating a schematic configuration of a liquid crystal display panel driven by a parted driving method.
Figure 21:
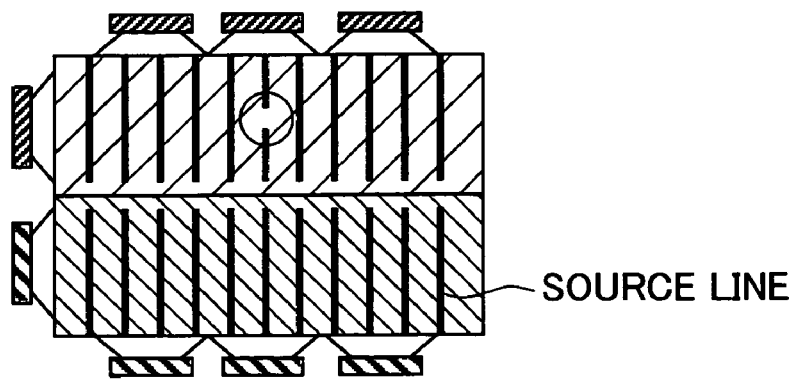

In the former driving method, wiring is sometimes provided outside the display region in consideration of the possibility of breakdown of source line (See FIG. 21(a)). With this structure, even if the source line is cut off, the region having lost the conduction can be driven by this wiring outside the display region. Such a configuration is however difficult to realize in the case of the parted driving method. This is because, in this structure, the source driver is provided on both upper and lower ends of the substrate.

However, in the configuration of the present invention, the auxiliary metallic member is used for increasing thickness of a film. Therefore, even if the wiring is partially cut off, the region having lost the conduction is still practically conducted by the auxiliary metallic member as shown in FIG. 21(b). As such, the panel adopting the foregoing parted driving method is not really affected by the breakdown of the source line. This improves the yield of the panel, and the manufacturing cost can be also reduced, as less number of panels is wasted.

As described, the present invention uses a conductive auxiliary material not only for periphery wiring but also for the wiring inside the panel. With this arrangement, the present invention achieves both lower resistance and tolerance to the atmosphere of manufacturing. Particularly, by forming the conductive auxiliary wiring only as an auxiliary component and only in a required portion by using a fluid material, the foregoing advantage is obtained with a minimum amount of the material.

Further, a suitable material, other than Ag, for the auxiliary metallic member of the present embodiment is Ag-alloy whose main constituent is Ag, such as AgIn, Ag In Al or the like. By adding a small amount (1 to 3%) of In to Ag, the adhesiveness of the auxiliary metallic member for the glass substrate 13 is improved, and volume resistivity is not increased. Further, depending on calcination temperature, the use of Ag alone may result in a rough surface due to a radical grain growth. In the case of forming wiring above the auxiliary metallic member, this rough surface of the auxiliary metallic member may cause a poor insulation between the auxiliary metallic member and the wiring. In view of the foregoing problem, the Ag In alloy having an excellent heat resistance is used, so that smoothness of the surface is not deteriorated.

Further, by increasing the amount of In by 5 to 10%, a plasma resistance is also improved. Therefore, by forming a film containing a larger amount of In on the surface of the auxiliary metallic member, it is possible to restrain the wiring from being damaged in the process of forming a TFT substrates.

In a case of using Ag In Al alloy, Al is added instead of increasing the amount of In, so that the plasma resistance is improved. This material is suitable for use in the process of manufacturing the active matrix substrate 10. In the examples shown in FIG. 15, it is important to have a smooth surface of a layer having the auxiliary metallic member 1. This is because the layer having the auxiliary metallic member 1 is located in the lowermost portion. Accordingly, it is more preferable to use an alloy (e.g. Ag In) having an excellent adhesiveness to the glass substrate than using Ag alone, so that a smooth surface is realized. It is needless to mention that the material of the auxiliary metallic member is not limited to Ag In.

Further, for example, it is possible to use a transparent conductive film (ITO) or the like for forming the conductive auxiliary line 51 shown in FIG. 15(b). This is aimed at improving, by forming an ITO film, the tolerance to etching under a plasma atmosphere, rather than lowering the resistance of the wiring 15. In a case where the wiring 15 is formed by spattering Ag or depositing Ag, the tolerance to plasma etching can be ensured by applying ITO on the upper surface of the wiring 15.

Note that a typical electronic device adopting the active matrix substrate of the present embodiment can be a display device, such as a liquid crystal display or an organic EL display. However, the electronic device adopting the active matrix substrate is not limited to the above listed display devices.

As described, an active matrix substrate of the present invention includes: a substrate; a plurality of signal lines; a plurality of scanning lines intersecting with the signal lines; switching elements, each being arranged nearby a portion where one of the signal lines intersects with one of the scanning lines; a peripheral line having at least a part of function of supplying signals to the signal lines and the scanning lines, the signal lines, the scanning lines, the switching elements, and the peripheral line being provided on the substrate, the active matrix substrate including a conductive auxiliary member, which is formed at least in a portion of wiring constituting the active matrix substrate.

Further, another active matrix substrate of the present invention includes: a substrate; a plurality of signal lines; a plurality of scanning lines intersecting with the signal lines; switching elements, each being arranged nearby a portion where one of the signal lines intersects with one of the scanning lines; pixel electrodes respectively connected with the switching elements; a peripheral line having at least a part of function of supplying signals to the signal lines and the scanning lines, the signal lines, the scanning lines, the switching elements, and the peripheral line being provided on the substrate, the active matrix substrate including a conductive auxiliary member, which is formed at least in a portion of wiring constituting the active matrix substrate or in a portion of a pixel electrode.

Further, the foregoing active matrix substrate may be adapted so that the conductive auxiliary member is formed by application of liquid.

Further, the foregoing active matrix substrate may be adapted so that the conductive auxiliary member is provided on the wiring.

Further, the foregoing active matrix substrate may be adapted so that the conductive auxiliary member is provided beneath the wiring.

Further, the foregoing active matrix substrate may be adapted so that the conductive auxiliary member is provided in wiring for electrically connecting terminals, except for a portion on terminals section.

Further, the foregoing active matrix substrate may be adapted so that: the conductive auxiliary member is provided in the peripheral line; and the peripheral line provides electrical connection between a plurality of drivers, which are respectively connected with terminals so as to supply signals at least to the signal lines or the scanning lines.

Further, the foregoing active matrix substrate may be adapted so that: (I) the conductive auxiliary member is provided to the peripheral lines; and (II) the peripheral lines provides electrical connection between a plurality of driver elements provided nearby the substrate, the driver element being for at least supplying a signal voltage to the signal lines or the scanning lines.

Further, the foregoing active matrix substrate may be adapted so that the conductive auxiliary member is provided in wiring, which is a part of a wiring electrically connected to pixel-capacitor wiring for forming a pixel electrode and a capacitor.

Further, the foregoing active matrix substrate may be adapted so that a surface resistance of wiring provided with the conductive auxiliary member is smaller than a surface resistance of metal which is used for constituting the signal lines, the scanning lines, and a pixel electrode.

Further, the foregoing active matrix substrate may be adapted so that a surface resistance of wiring provided with the conductive auxiliary member is 0.2 $\Omega/\square$ or less.

Further, the foregoing active matrix substrate may be adapted so that the conductive auxiliary member includes at least one of Ag, Au, Cu, and Al.

Further, the foregoing active matrix substrate may be adapted so that the conductive auxiliary member is an oxidized conductive material.

Further, the foregoing active matrix substrate may be adapted so that a thickness of the conductive auxiliary member is equal to or greater than a thickness of the wiring on which the conductive auxiliary member is to be formed.

Further, the foregoing active matrix substrate may be adapted so that at least a portion of the conductive auxiliary member made of a metal includes an oxidized conductive material serving as a foundation material.

In the foregoing configuration, an oxidized conductive material which is lyophilic is used as the foundation. This allows easier application of the material for the auxiliary member in the case where an adhesiveness between the general wiring and the metal material is poor, or in the case where a metal for constituting the auxiliary metallic member is formed by an inkjet method.

Further, the foregoing active matrix substrate may be adapted so that at least a part of a periphery of a region in which the conductive auxiliary member is formed is surrounded by a resin material.

In the foregoing configuration, it is possible to use the conventional resin material to prevent the material for the auxiliary member from flowing out when the material is applied by an inkjet method.

Further, the foregoing active matrix substrate may be adapted so that at least a part of a surface of the conductive auxiliary member is coated with an insulative material.

In the foregoing configuration, it is possible to use the insulative material to prevent the material for the auxiliary member from flowing out when the material is applied by an inkjet method.

Further, the foregoing active matrix substrate may be adapted so that at least a part of a surface of the conductive auxiliary member is coated with an oxidized conductive material.

With the foregoing configuration, for example, it is possible to reinforce the tolerance to manufacturing in the case where the material of the auxiliary member applied by an inkjet method has an insufficient r tolerance.

Further, a method of the present invention for manufacturing any of the foregoing active matrix substrates, includes the step of: forming a conductive auxiliary member with respect to at least a portion of wiring constituting the active matrix substrate, the conductive auxiliary member being formed by ejecting or dropping a fluid material containing metal fine particles with respect to a desirable position.

In the foregoing method, a mask is not needed for forming the conductive auxiliary member. Thus, in addition to the advantages from the foregoing active matrix substrate, the method has the following advantages. Namely, it is possible to omit a process of forming a film for metal wiring and an etching process. This allows reduction of a facility cost for photolithography. Further, it is possible to reduce an amount of a material being wasted. Thus, manufacturing time and cost can be reduced.

Further, in the foregoing method of the present invention, the conductive auxiliary member is formed by heating the fluid material after the fluid material is applied.

Further, in the foregoing method of the present invention, the fluid material is a solution containing a metal complex; and the conductive auxiliary member is formed by reducing the metal complex after the fluid material is applied so as to extract a metal solid.

Further, in the foregoing method of the present invention, the fluid material is applied by being ejected by an inkjet method.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An active matrix substrate, comprising:
    a substrate;
    a plurality of signal lines;
    a plurality of scanning lines intersecting with the signal lines;
    switching elements, each being arranged nearby a portion where one of the signal lines intersects with one of the scanning lines;
    a peripheral line having at least a function of supplying signals to the signal lines and the scanning lines, the signal lines, the scanning lines, the switching elements, and the peripheral line being provided on the substrate; and the active matrix substrate further comprising: a protection layer formed on the substrate; a resin layer formed on the protection layer; a groove configured in the protection layer and the resin layer or configured in the substrate; and a conductive auxiliary member filled in the groove and in continuous longitudinal contact along a substantial length of one of said signal lines, said scanning lines or said peripheral line on said active matrix substrate so as to lower a combined resistance value of the conductive auxiliary member and one of the signal lines, said scanning lines or said peripheral line.

2. The active matrix substrate as set forth in claim 1, wherein the conductive auxiliary member is provided on top of the one of said signal lines, said scanning lines, or said peripheral line.

3. The active matrix substrate as set forth in claim 1, wherein the conductive auxiliary member is provided beneath the one of said signal lines, said scanning lines, or said peripheral line.

4. The active matrix substrate as set forth in claim 1, wherein the portion of one of said signal lines, said scanning lines, or said peripheral line is for electrically connecting terminals, except for portions at a terminal end of said lines.

5. The active matrix substrate as set forth in claim 1, wherein:
the portion of wiring comprises the peripheral line; and
the peripheral line provides electrical connection between a plurality of drivers, which are respectively connected with terminals so as to supply signals at least to the signal lines or the scanning lines.

6. The active matrix substrate as set forth in claim 1, wherein:
the portion of wiring comprises the peripheral line; and
the peripheral line applies signal voltages to a driver element provided nearby the substrate, the driver element supplying signals at least to the signal lines or the scanning lines.

7. The active matrix substrate as set forth in claim 1, wherein the portion of wiring includes a part of a wiring electrically connected to pixel-capacitor wiring for forming a pixel electrode and a capacitor.

8. The active matrix substrate as set forth in claim 1, wherein a surface resistance of a material used to form the conductive auxiliary member is smaller than a surface resistance of metal which is used for constituting the signal lines, the scanning lines, and a pixel electrode.

9. The active matrix substrate as set forth in claim 1, wherein a surface resistance of a material used to form the conductive auxiliary member is 0.2 Ω/□ or less.

10. The active matrix substrate as set forth in claim 1, wherein the conductive auxiliary member includes at least one of Ag, Au, Cu, and Al.

11. The active matrix substrate as set forth in claim 1, wherein the conductive auxiliary member is an oxidized conductive material.

12. The active matrix substrate as set forth in claim 1, wherein a thickness of the conductive auxiliary member is equal to or greater than a thickness of the wiring on which the conductive auxiliary member is formed.

13. The active matrix substrate as set forth in claim 1, wherein at least a portion of the conductive auxiliary member made of a metal includes an oxidized conductive material serving as a foundation material.

14. The active matrix substrate as set forth in claim 1, wherein at least a part of a periphery of a region in which the conductive auxiliary member is formed is surrounded by a resin material.

15. The active matrix substrate as set forth in claim 1, wherein at least a part of a surface of the conductive auxiliary member is coated with an insulative material.

16. The active matrix substrate as set forth in claim 1, wherein at least a part of a surface of the conductive auxiliary member is coated with an oxidized conductive material.

17. The active matrix substrate as set forth in claim 1, wherein a guide layer is formed on surfaces of the groove and the conductive auxiliary member is filled in the guide layer.

18. An active matrix substrate, comprising:
a substrate;
a plurality of signal lines;
a plurality of scanning lines intersecting with the signal lines;
switching elements, each being arranged nearby a portion where one of the signal lines intersects with one of the scanning lines;
pixel electrodes respectively connected with the switching elements;
a peripheral line having at least a function of supplying signals to the signal lines and the scanning lines, the signal lines, the scanning lines, the switching elements, and the peripheral line being provided on the substrate; and
the active matrix substrate further comprising: a protection layer formed on the substrate; a resin layer formed on the protection layer; a grove configured in the protection layer and the resin layer or configured in the substrate; and a conductive auxiliary member filled in the groove and in continuous longitudinal contact with a substantial length of said pixel electrodes so as to lower a combined resistance value of the conductive auxiliary member and one of the signal lines, said scanning lines or said peripheral line.

19. The active matrix substrate as set forth in claim 18, wherein the conductive auxiliary member is provided on top of the pixel electrodes.

20. The active matrix substrate as set forth in claim 18, wherein the conductive auxiliary member is provided beneath the pixel electrodes.

21. The active matrix substrate as set forth in claim 18, wherein the portion of said pixel electrodes is for electrically connecting terminals, except for portions at a terminal end of said pixel electrodes.

22. The active matrix substrate as set forth in claim 18, wherein:
the portion of wiring comprises the peripheral line; and
the peripheral line provides electrical connection between a plurality of drivers, which are respectively connected with terminals so as to supply signals at least to the signal lines or the scanning lines.

23. The active matrix substrate as set forth in claim 18, wherein:
the portion of wiring comprises the peripheral line; and
the peripheral line applies signal voltages to a driver element provided nearby the substrate, the driver element supplying signals at least to the signal lines or the scanning lines.

24. The active matrix substrate as set forth in claim 18, wherein the portion of wiring includes a part of a wiring electrically connected to pixel-capacitance wiring for forming a pixel electrode and providing a capacitance.

25. The active matrix substrate as set forth in claim 18, wherein a surface resistance a material used to form the conductive auxiliary member is smaller than a surface resistance of metal for use in the signal lines, the scanning lines, and a pixel electrode.

26. The active matrix substrate as set forth in claim 18, wherein a surface resistance of a material used to form the conductive auxiliary member is 0.2 Ω/☐ or less.

27. The active matrix substrate as set forth in claim 18, wherein the conductive auxiliary member includes at least one of Ag, Au, Cu, and Al.

28. The active matrix substrate as set forth in claim 18, wherein the conductive auxiliary member is an oxidized conductive material.

29. The active matrix substrate as set forth in claim 18, wherein a thickness of the conductive auxiliary member is equal to or greater than a thickness of the wiring on which the conductive auxiliary member is formed.

30. The active matrix substrate as set forth in claim 18, wherein at least a portion of the conductive auxiliary member made of a metal includes an oxidized conductive material serving as a foundation material.

31. The active matrix substrate as set forth in claim 18, wherein at least a part of a region in which the conductive auxiliary member is formed is surrounded by a resin material.

32. The active matrix substrate as set forth in claim 18, wherein at least a part of a surface of the conductive auxiliary member is coated with an insulative material.

33. The active matrix substrate as set forth in claim 18, wherein at least a part of a surface of the conductive auxiliary member is coated with an oxidized conductive material.

34. The active matrix substrate as set forth in claim 18, wherein a guide layer is formed on surfaces of the groove and the conductive auxiliary member is filled in the guide layer.

35. An electronic device comprising an active matrix substrate including:
a substrate;
a plurality of signal lines;
a plurality of scanning lines intersecting with the signal lines;
switching elements, each being arranged nearby a portion where one of the signal lines intersects with one of the scanning lines;
a peripheral line having at least a function of supplying signals to the signal lines and the scanning lines,
the signal lines, the scanning lines, the switching elements, and the peripheral line being provided on the substrate; and
the active matrix substrate further comprising: a protection layer formed on the substrate; a resin layer formed on the protection layer; a groove configured in the projection layer and the resin layer or configured in the substrate; and a conductive auxiliary member filled in the groove and in continuous longitudinal contact along a substantial length of one of said signal lines, said scanning lines or said peripheral line on said active matrix substrate so as to lower a combined resistance value of the conductive auxiliary member and one of said signal lines, said scanning lines or said peripheral line.

36. The electronic device as set forth in claim 35, wherein a guide layer is formed on surfaces of the groove and the conductive auxiliary member is filled in the guide layer.

37. An electronic device comprising an active matrix substrate including:
a substrate;
a plurality of signal lines;
a plurality of scanning lines intersecting with the signal lines;
switching elements, each being arranged nearby a portion where one of the signal lines intersects with one of the scanning lines;
pixel electrodes respectively connected with the switching elements;
a peripheral line having at least a function of supplying signals to the signal lines and the scanning lines,
the signal lines, the scanning lines, the switching elements, and the peripheral line being provided on the substrate; and
the active matrix substrate further comprising: a protection layer formed on the substrate; a resin layer formed on the protection layer; a groove configured in the protection layer and the resin layer or configured in the substrate; and a conductive auxiliary member filled in the groove and in continuous longitudinal contact with a substantial length of said pixel electrodes so as to lower a combined resistance value of the conductive auxiliary member and one of said signal lines, said scanning lines or said peripheral line.

38. The electronic device as set forth in claim 37, wherein a guide layer is formed on surfaces of the groove and the conductive auxiliary member is filled in the guide layer.

* * * * *